United States Patent
Miura et al.

(10) Patent No.: US 8,039,405 B2
(45) Date of Patent: Oct. 18, 2011

(54) CONDUCTIVE OXIDE-DEPOSITED SUBSTRATE AND METHOD FOR PRODUCING THE SAME, AND MIS LAMINATED STRUCTURE AND METHOD FOR PRODUCING THE SAME

(75) Inventors: Hiroshi Miura, Yamato (JP); Kohji Takeuchi, Isehara (JP); Nobuaki Toyoshima, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 279 days.

(21) Appl. No.: 12/362,708

(22) Filed: Jan. 30, 2009

(65) Prior Publication Data

US 2009/0194767 A1    Aug. 6, 2009

(30) Foreign Application Priority Data

Feb. 1, 2008 (JP) ................. 2008-022207
Jul. 25, 2008 (JP) ................. 2008-192097
Dec. 12, 2008 (JP) ................. 2008-316867
Jan. 9, 2009 (JP) ................. 2009-003126

(51) Int. Cl.
H01L 21/00 (2006.01)
H01L 29/10 (2006.01)

(52) U.S. Cl. .................. 438/798; 257/43
(58) Field of Classification Search .......... 257/43, 257/659; 438/104, 798, 149
See application file for complete search history.

(56) References Cited

U.S. PATENT DOCUMENTS

| 5,403,673 | A | 4/1995 | Haga et al. | |
|---|---|---|---|---|
| 2002/0016075 | A1* | 2/2002 | Peng et al. | 438/700 |
| 2004/0183130 | A1* | 9/2004 | Hara | 257/331 |
| 2006/0046460 | A1 | 3/2006 | Shu | |
| 2007/0052025 | A1 | 3/2007 | Yabuta | |
| 2008/0296568 | A1* | 12/2008 | Ryu et al. | 257/43 |

FOREIGN PATENT DOCUMENTS

| JP | 3229610 | 9/2001 |
|---|---|---|
| JP | 2002-116714 | 4/2002 |
| JP | 2006-4594 | 1/2006 |
| JP | 2006-66362 | 3/2006 |
| JP | 2006-114428 | 4/2006 |
| JP | 2007-123700 | 5/2007 |
| JP | 2007-194628 | 8/2007 |

OTHER PUBLICATIONS

Kenji Nomura et al., "Room-temperature fabrication of transparent flexible thin-film transistors using amorphous oxide semiconductors", Nature, vol. 432, Nov. 25. 2004, pp. 488-492.

\* cited by examiner

Primary Examiner — Calvin Lee
(74) Attorney, Agent, or Firm — Oblon, Spivak, McClelland, Maier & Neustadt, L.L.P.

(57) ABSTRACT

A method for producing a conductive oxide-deposited substrate including depositing a conductive oxide thin film over a substrate, subjecting the conductive oxide thin film to heat treatment by irradiating with a condensed laser beam so as to be thermally changed in part, and subjecting the conductive oxide thin film to etching treatment so as to remove a part which has not been thermally changed, wherein the conductive oxide thin film absorbs the laser beam, and at least a part of the conductive oxide thin film is an amorphous phase.

11 Claims, 17 Drawing Sheets

Prior Art

1 μm

400nm

400nm

Measurement wavelength: 400 nm
Sample: polycarbonate substrate/ITO thin film (150nm-thick)

Measurement condition: Cukα radiation, accelerating voltage of 45keV, and a current value of 40 mA
Sample: polycarbonate substrate/ITO thin film (150nm-thick)

FIG. 22A

| Characteristics of shape of MIS laminated structure | | | Method for processing MIS laminated structure | | | | |
|---|---|---|---|---|---|---|---|
| MIS laminated structure | | Shape characteristics | MIS laminated material | Laser beam absorption | Heat accumulation | Selectivity to a hydrochloric acid solution | Processed shape |
| Upper layer M | Conductive material | Small (gate region) | Conductive material having oxygen deficiency | Large | Small | Exhibited | Small |
| Intermediate layer I | Insulating material | | Insulating material | | | Not exhibited | |
| Under layer S | Semiconductor material | Large (gate, source and drain region) | Semiconductor material | Small | Large | Exhibited | Large |

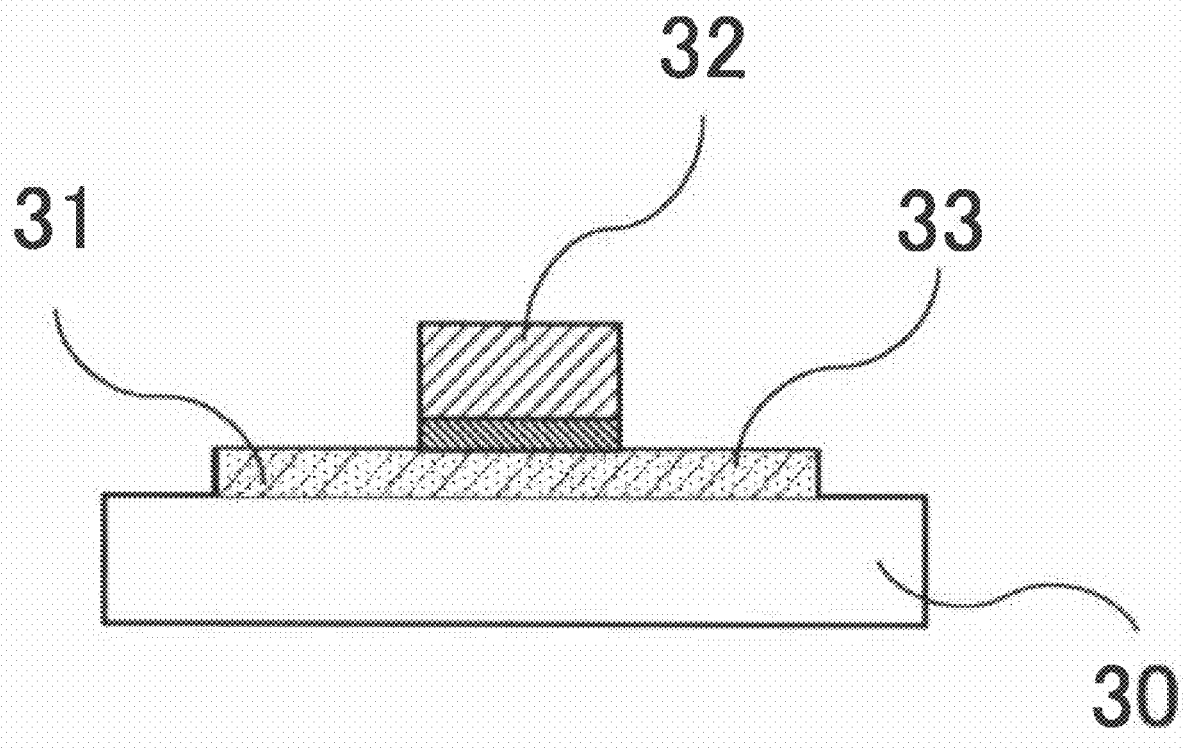

_US 8,039,405 B2_

CONDUCTIVE OXIDE-DEPOSITED SUBSTRATE AND METHOD FOR PRODUCING THE SAME, AND MIS LAMINATED STRUCTURE AND METHOD FOR PRODUCING THE SAME

BACKGROUND OF THE INVENTION

1. Field of the Invention

The present invention relates to a method for producing a conductive oxide-deposited substrate and a conductive oxide-deposited substrate which is used for producing functional devices such as displays, image sensors, solar batteries and illuminations using solid light sources.

The present invention also relates to a method for producing a MIS laminated structure which is a basic structure of a switching element which controls charge transfer in connection with a light receiving and emitting element and a memory element, and a MIS laminated structure.

2. Description of the Related Art

Conventionally, a conductive oxide-deposited substrate represented by $In_2O_3$—$SnO_2$ (ITO: Indium-Tin-Oxides) which is processed in a wiring shape is used in displays, image sensors or the like. In devices having functional surfaces such as solar batteries and illumination using solid light sources, a conductive oxide-deposited substrate in which a conductive oxide is processed into a concavo-convex shape is used for the purpose of enhancing efficiency of current collection or taking in and removing light. The conductive oxide is generally processed by a method of processing the conductive oxide by photolithography using a photomask.

For example, Japanese Patent Application Laid-Open (JP-A) No. 2006-066362 discloses a method for producing an ITO film including a step of forming a pattern in the ITO film which includes a step of forming a photoresist layer, in which a pattern is formed, on the ITO film, a step of removing a part of the ITO film using the photoresist layer, and a step of removing the photoresist layer.

JP-A No. 2006-114428 discloses that an ITO film is ablated by a laser beam, which is photolytic reaction, and the ITO film is selectively irradiated with a laser beam so as to remove an irradiated area of the ITO film, thereby forming a removed pattern in the ITO film.

Japanese Patent (JP-B) No. 3229610 discloses a method for producing an ITO electrode, wherein an ITO film having a resistance of $1\times10^{-3}\Omega\cdot cm$ or more is deposited and etched in a given pattern, a film needs to be heated is deposited, and then the film and the ITO film are simultaneously heated in a clean oven so as to decrease the resistance of the ITO film to less than $1\times10^{-3}\Omega\cdot cm$, thereby producing an ITO electrode.

In JP-A No. 2006-004594, the inventors of the present invention propose a method of forming a fine structure, including at least a step of irradiating a medium with light, and a step of etching the medium, wherein the medium has a laminated structure consisting of a light absorption layer and a thermal reactive layer.

However, these related arts do not disclose the invention of directly processing and forming a conductive part into a pattern using light.

To a light receiving and emitting element, a switching element consisting of a thin film transistor and the like is connected to control charge transfer. Recently, as a semiconductor material for such switching element, a development of a technology using an organic semiconductor is outstandingly progressed. That is, by the use of an organic semiconductor as a semiconductor material of the switching element, a low temperature wet process such as an inkjet printing process, spin coating process and printing process can be employed upon production of an element. As a result, the cost of the process can be decreased, a substrate can be formed of a plastic, and moreover a flexible device can be expected.

On the other hand, the semiconductor property of an organic semiconductor material such as charge transfer degree has not been satisfied, as it now stands. For example, as disclosed in "Nature, Vol. 432 (2004) 488" and JP-A No. 2007-194628, an inorganic semiconductor material capable of being formed by a low temperature process is vigorously developed.

Examples of methods for producing a switching element, in which an inorganic semiconductor material is formed into a semiconductor layer, include a method for patterning each layer using both wet etching treatment and dry etching treatment as disclosed in JP-A No. 2002-116714, and a method for producing a switching element only by a wet etching treatment as disclosed in JP-A No. 2007-123700.

Any methods described above require a step of forming a resist mask by photolithography.

A method for producing a thin film transistor by a conventional photolithography and etching treatment is shown in FIGS. 1A to 1D. FIGS. 1A to 1E are cross sectional views of an example of a structure of a top-gate thin film transistor.

FIG. 1A shows a photolithography process of a semiconductor thin film performed in an arrow direction. A photoresist 6 is coated on a semiconductor thin film 5 and patterned by photolithography 7, the patterned photoresist 6 is covered with an etching mask 8, and then the semiconductor thin film is processed.

FIG. 1B shows a photolithography process of source and drain electrodes performed in an arrow direction. 9 denotes a source and drain electrode thin film, 10 denotes a photoresist, and 11 denotes photolithography.

FIG. 1C shows a photolithography process of a gate insulating film performed in an arrow direction, 12 denotes a gate insulating film, 13 denotes a photoresist and 14 denotes photolithography.

FIG. 1D shows a photolithography process of a gate electrode performed in an arrow direction. 15 denotes a gate electrode thin film, 16 denotes a photoresist and 17 denotes photolithography. FIG. 1E shows an example of a basic structure of a thin film transistor, in which 18 denotes a substrate, 19 denotes a semiconductor thin film, 20 denotes a gate insulating film, 21 denotes a source electrode, 22 denotes a drain electrode and 23 denotes a gate electrode.

The conventional methods need four photolithography processes, when a basic structure of a thin film transistor as shown in FIG. 1E is produced. The process cost increases according to the number of photomasks and processes. Therefore, the issue of device cost reduction is solved by decrease of the number of photolithography processes. Additionally, there is an issue how to avoid plasma damage on a resin substrate material when an inorganic semiconductor material on a plastic substrate is processed by a dry etching method.

BRIEF SUMMARY OF THE INVENTION

An object of the present invention is to provide a method for producing a conductive oxide-deposited substrate, and a conductive oxide-deposited substrate by easy process mainly including a heat treatment by laser beam irradiation and an etching treatment, at low cost compared to the conventional technology.

Another object of the present invention is to provide a MIS laminated structure which is a basic structure of a switching element which is advantageous for miniaturization of element, and enables to simplify the production process, to achieve lower cost than the conventional technology, and to control charge transfer, and to provide a method for producing a MIS laminated structure.

Means for solving the above-mentioned problems are as follows.

<1> A method for producing a conductive oxide-deposited substrate including: depositing a conductive oxide thin film over a substrate; subjecting the conductive oxide thin film to heat treatment by irradiating with a condensed laser beam so as to be thermally changed in part; and subjecting the conductive oxide thin film to etching treatment so as to remove a part which has not been thermally changed, wherein the conductive oxide thin film absorbs the laser beam, and at least a part of the conductive oxide thin film is an amorphous phase.

In the method for producing a conductive oxide-deposited substrate according to <1>, a structure of a conductive oxide can be easily formed by laser beam irradiation and etching treatment. A substrate on which a structure of a conductive oxide is formed can be provided at low cost without employing photolithography using a photomask.

<2> The method for producing a conductive oxide-deposited substrate according to <1>, wherein the heat treatment includes irradiating a laminate consisting of the substrate and the conductive oxide thin film, which is obtained in the film deposition with a laser beam, while the laminate is being rotated.

In the method for producing a conductive oxide-deposited substrate according to <2>, the substrate can be irradiated with a laser beam by using a laser beam irradiation device equipped with a mechanism of rotating the substrate, while the substrate is being rotated at high speed. Thus, a pattern can be formed in a wide area at high speed.

<3> The method for producing a conductive oxide-deposited substrate according to <1> or <2>, further including depositing another film after the etching treatment.

In the method for producing a conductive oxide-deposited substrate according to <3>, a surface electrode having a structure in which a surface is conductive and an effective surface area of the laminated film can be increased by an easy method.

<4> The method for producing a conductive oxide-deposited substrate according to any one of <1> to <3>, wherein the condensed laser beam is a semiconductor laser beam having the wavelength of 360 nm to 420 nm.

In the method for producing a conductive oxide-deposited substrate according to <4>, a pattern can be formed by a laser beam irradiation device using a semiconductor laser at low cost. A fine structure can be easily formed, in particular, by using a semiconductor laser at a wavelength range of blue light, in which cost reduction and high output is achieved recently, and a power level can be modulated at high speed.

<5> A conductive oxide-deposited substrate produced by the method for producing a conductive oxide-deposited substrate according to any one of <1> to <4>, wherein a convex-shaped structure of the conductive oxide is formed on at least one surface of the substrate.

<6> The conductive oxide-deposited substrate according to <5>, wherein the conductive oxide-deposited substrate contains a plurality of the convex-shaped structures on the substrate, and the convex-shaped structures are arranged at a pitch of 200 nm to 500 nm on the substrate.

<7> A method for producing a MIS laminated structure by laser beam irradiation and etching treatment, including: depositing a semiconductor material layer S, an insulating material layer I, and a conductive oxide material layer M in this order over a supporting substrate so as to form the MIS laminated structure; subjecting the MIS laminated structure to heat treatment by irradiating with a condensed laser beam from the conductive oxide material layer side so as to thermally change a part of the conductive oxide material layer, and to thermally change a part of the semiconductor material layer by heat spread in the MIS laminated structure; and subjecting the MIS laminated structure to etching treatment so as to remove a part which has not been thermally changed, wherein the conductive oxide thin film absorbs the laser beam, and at least a part of the conductive oxide thin film is an amorphous phase.

<8> The method for producing a MIS laminated structure according to <7>, wherein the condensed laser beam is a semiconductor laser beam having the wavelength of 360 nm to 420 nm.

<9> The method for producing a MIS laminated structure according to <7> or <8>, wherein the etching treatment is performed in accordance with a wet etching method.

<10> A MIS laminated structure including: a supporting substrate, a semiconductor material S, an insulating material I, and a conductive oxide material M are deposited in this order over the supporting substrate so as to form a MIS laminated structure, wherein the MIS laminated structure is produced by the method for producing a MIS laminated structure according to any one of <7> to <9>.

<11> The MIS laminated structure according to <10>, wherein the semiconductor material layer S contains a material selected from $In_2O_3$, $SnO_2$ and ZnO.

<12> The MIS laminated structure according to <10> or <11>, wherein a processed part of the MIS laminated structure is circle or elliptical shape.

<13> The MIS laminated structure according to any one of <10> to <12>, wherein the supporting substrate has a convex-shaped part on a surface thereof, on which the MIS laminated structure is produced.

According to the present invention, a substrate on which a conductive oxide is processed into a shape by an easy process mainly including a heat treatment step by laser beam irradiation and etching treatment step. Moreover, the present invention is made by focusing on change of an etching rate between an irradiated part and other parts, which is caused by an etching rate difference due to high crystallization in a part irradiated with a laser beam. According to the present invention, a conductive oxide thin layer in which a non-irradiated part is removed by etching treatment is formed into a pattern on a substrate can be provided at low cost.

According to the method for producing a MIS laminated structure of the present invention, a MIS laminated structure consisting of a semiconductor material layer S, an insulating material layer I and a conductive oxide material layer M deposited over a supporting substrate is irradiated with a laser beam, so that a conductive oxide material layer and a semiconductor material layer are thermally changed (crystallized). Then the MIS laminated structure is subjected to etching treatment using an etching selectivity between a thermally changed part and a non-changed part, so as to produce a switching element structure formed from the MIS laminated structure. That is, the MIS laminated structure which is a basic structure of a switching element structure can be produced by an easy process mainly including the heat treatment and etching treatment without using the conventional photolithography process. The simplified production process enables to reduce the cost, and fine and regular MIS laminated structures can be produced.

For example, when the conventional photolithography is used, generally, four photolithography processes using four photomasks are necessary. However, in the method of the present invention, photomasks are not necessary.

The MIS laminated structure of the present invention is processed using a condensed laser beam, and edges of a structure of MIS laminated structure and an electrode are curved or in the shape of circle and become a nonangular shape according to the laser beam shape. Thus, when a protective film or the like is laminated on the element, stress concentration on the element edges can be prevented, so that the MIS laminated structure has an advantageous shape, which contributes to stable behavior of the element. Moreover, the element structures are fine and regular, so that a stable switching operation can be expected.

BRIEF DESCRIPTION OF THE DRAWINGS

FIGS. 22A and 22B show a principle of a method for producing a MIS laminated structure of the present invention

DETAILED DESCRIPTION OF THE INVENTION (A Method for Producing a Conductive Oxide-Deposited Substrate and Conductive Oxide-Deposited Substrate)

A method for producing a conductive oxide-deposited substrate of the present invention, including depositing a conductive oxide thin film over a substrate; subjecting the conductive oxide thin film to heat treatment by irradiating with a condensed laser beam so as to be thermally changed in part; and subjecting the conductive oxide thin film to etching treatment so as to remove a part which has not been thermally changed, and further including other steps as necessary.

A conductive oxide-deposited substrate of the present invention is produced by the method for producing the conductive oxide-deposited substrate of the present invention, and has a convex-shaped structure of the conductive oxide at least in a surface of a supporting substrate.

Hereinafter, with reference to drawings, the method for producing a conductive oxide-deposited substrate and the conductive oxide-deposited substrate obtained by the method according to the present invention will be specifically explained.

The First Embodiment

Figure 1A:
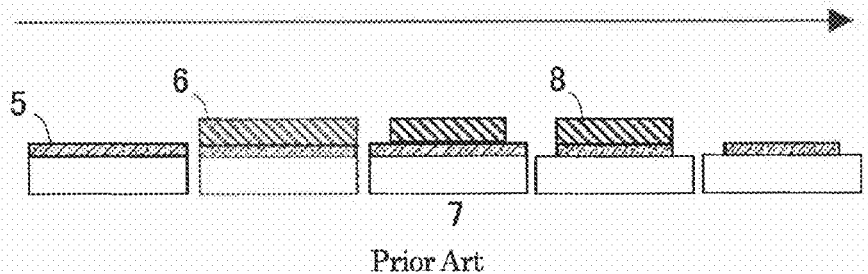
FIG. 1A shows a photolithography process of a semiconductor thin film by a conventional photolithography and etching treatment in a production process of a top gate thin film transistor.
Figure 1B:
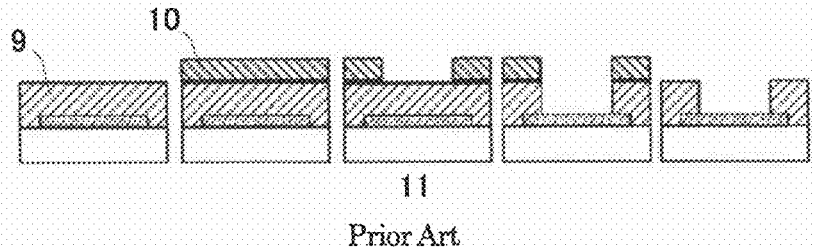
FIG. 1B shows a photolithography process of source and drain electrodes by a conventional photolithography and etching treatment in a production process of a top gate thin film transistor.
Figure 1C:
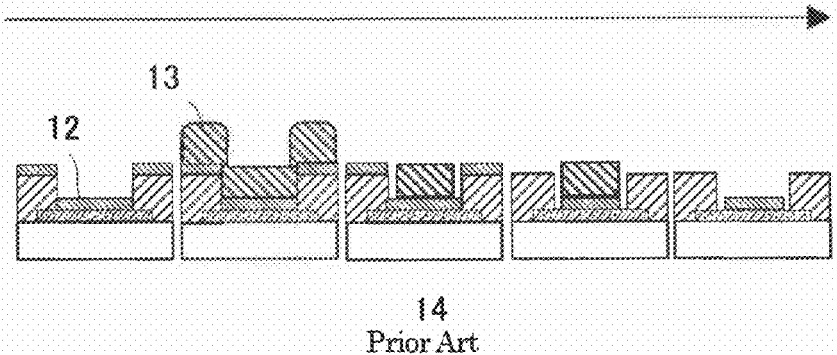
FIG. 1C shows a photolithography process of a gate insulating film by a conventional photolithography and etching treatment in a production process of a top gate thin film transistor.
Figure 1D:
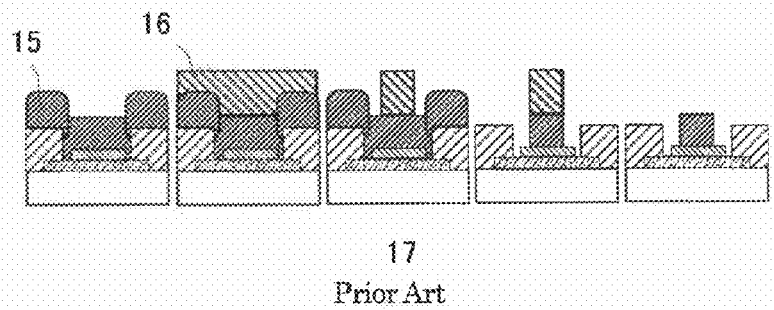
FIG. 1D shows a photolithography process of a gate electrode by a conventional photolithography and etching treatment in a production process of a top gate thin film transistor.
Figure 1E:
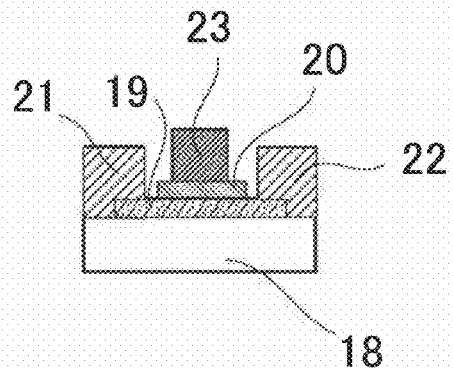
FIG. 1E shows an example of a basic structure of a thin film transistor.
Figure 2A:
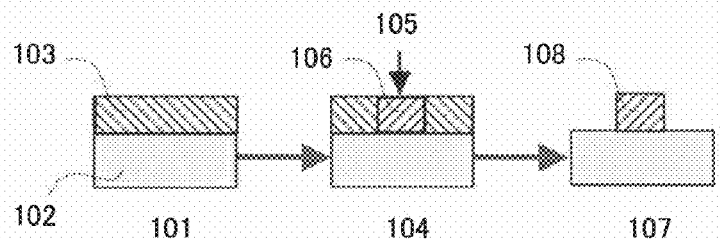
FIG. 2A is a view illustrating a first method for producing a conductive oxide-deposited substrate of the present invention.

FIG. 2A shows a method for producing a conductive oxide-deposited substrate of the present invention (the first production process).

In FIG. 2A, 101 denotes a conductive oxide film deposition step, 102 denotes a substrate (supporting substrate), and 103 denotes a conductive oxide layer deposited on at least one surface (at least a part of the surface) of the substrate. The substrate used in the present invention is a substrate having a layer which has a function of recording medium in both surfaces or one surface in the same manner as CD, DVD or the like, and not a recording medium layer but a conductive oxide layer in the present invention is deposited on at least a part of one surface of the substrate. As a material of the substrate 102, for example, an inorganic substrate such as glass, quartz, silicon or a plastic substrate can be used.

Examples of the materials for the plastic substrates include polycarbonate, acrylic resins, polyethylene terephthalate (PET), polybutylene terephthalate (PBT), and PBT-PET.

In FIG. 2A, 103 denotes a conductive oxide thin film. As conductive oxide of the conductive oxide thin film, $In_2O_3$, $SnO_2$ and $In_2O_3$—$SnO_2$ (ITO) can be used. Alternatively, materials in which a metal element such as Al, Ga, Zn, etc. is added in these conductive oxide materials may be used.

For conductive oxide film deposition, a sputtering method can be used, for example.

Generally, when a conductive oxide material is deposited by a sputtering method, a reactive sputtering method, in which film deposition is performed in an atmosphere where oxygen gas is added to argon gas, is used in order to compensate oxygen deficiency in the stoichiometric composition. However, in this embodiment, since a conductive oxide having less oxygen than that of stoichiometric composition, i.e. oxygen deficiency, is formed, film deposition is preferably performed in an argon gas atmosphere without adding oxygen gas. The conductive oxide has oxygen deficiency, so that the transmittance is decreased and light absorption ability increases.

$In_2O_3$, $SnO_2$, $In_2O_3$—$SnO_2$ (ITO) and the like for the conductive oxide thin film can easily control transmittance by switching loading gas in sputtering film deposition. They are suitable materials used in a process of heating by a laser in the present invention. Hereinafter, with reference to an example of $In_2O_3$—$SnO_2$ (ITO) as a conductive oxide, an embodiment of the present invention will be explained.

Figure 11:
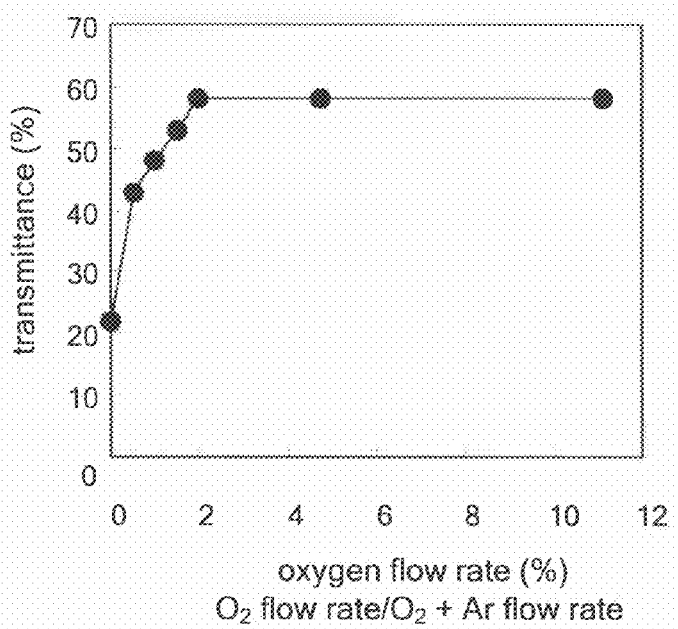
FIG. 11 is a graph showing a change of transmittance of an ITO thin film.

The conductive oxide thin film absorbs the laser beam, and at least a part of the conductive oxide thin film is an amorphous phase. The conductive oxide thin film preferably has a transmittance of 10% to 30% at a measurement wavelength of 400 nm. FIG. 11 is a graph showing a change of a transmittance depending on conditions of ITO thin film deposition ($O_2$ flow rate). The structure of a sample of which transmittance is measured is as shown in 101 of FIG. 2A. 102 denotes a polycarbonate substrate which is a supporting substrate. 103 denotes an ITO thin film. The ITO thin film is deposited by DC sputtering using a composite oxide of $In_2O_3$—$SnO_2$ (ITO) as a sputtering target at a pressure of 0.8 Pa with the substrate temperature kept at room temperature, i.e. under the condition that the substrate is not heated. The composite ratio (mass ratio) of the target material, $In_2O_3$:$SnO_2$ is 95:5 (% by mass). The ITO thin film 103 has a thickness of 150 nm. A plurality of ITO thin films are deposited by changing the ratio of argon (Ar) and oxygen ($O_2$), which are used as atmospheric gas, and the transmittance thereof are respectively measured by a UV-VIS Spectrophotometer (UV-2500(PC)SGLP manufactured by Shimadzu corporation). As shown in FIG. 11, the horizontal axis represents a mixing ratio between Ar and $O_2$ based on oxygen flow rate (%) "$O_2$ flow rate/($O_2$+Ar flow rate)". The vertical axis represents transmittance (%). The transmittance of the ITO thin film is measured at the wavelength range of 250 nm to 800 nm. FIG. 11 shows a transmittance value at a wavelength of 400 nm. As in FIG. 11, the transmittance at a wavelength of 400 nm decreases, as the oxygen flow rate becomes small. The ITO thin film has a transmittance of 22%, when it is deposited in an argon atmosphere without introducing $O_2$ (oxygen flow rate=0%). The oxygen deficiency of the conductive oxide thin film causes the decrease of transmittance due to the decrease of oxygen flow rate. The oxygen deficiency is a state where a thin film contains less oxygen than that of stoichiometric composition at least in part. Namely, the oxygen deficiency is the state described as follows. The ITO thin film originally has a composite ratio of $In_2O_3$—$SnO_2$. When the true composite ratio of the ITO thin film in the state of the oxygen deficiency is expressed by $In_2O_x$—$SnO_y$, x is less than three (x<3) and y is less than two (y<2). Note that, x and y each represents a valency of oxygen atom in the composition. When the ITO thin film has a transmittance of 10% to 30% at a wavelength of 400 nm, the absorption ability of a laser beam is improved so that a thin film can generate heat by laser beam irradiation and be thermally changed, as described later. The minimum value of the transmittance is 10%, because it is the minimum value obtained by easy control of oxygen flow rate in film deposition by sputtering. When the transmittance is higher than 30%, excessively high energy is necessary to thermally change the conductive oxide thin film by laser beam irradiation, thereby requiring an expensive laser beam irradiation device. Thus, an inexpensive semiconductor laser cannot be used.

Figure 12:
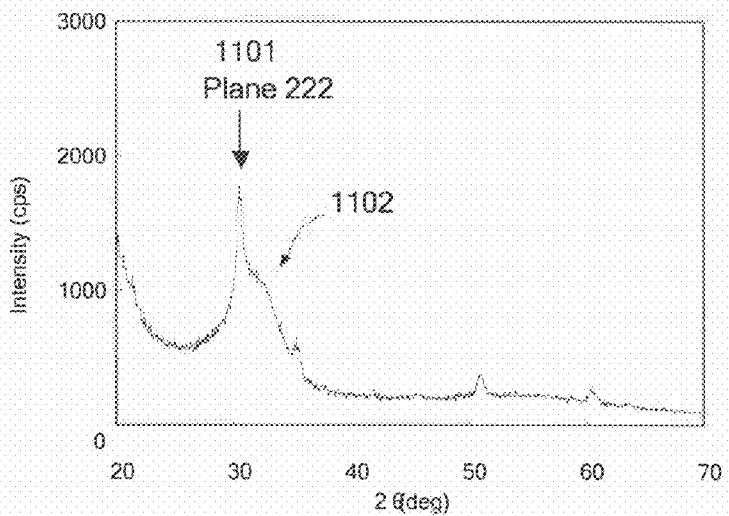
FIG. 12 is an X-ray diffraction pattern of an ITO thin film showing a crystalline state after film deposition.

The crystalline state of the ITO thin film is an amorphous phase at least in a part of the ITO thin film. With reference to the result of the X-ray diffraction measurement, the crystalline state of the ITO thin film will be explained. Measurement is performed by using an X-ray diffraction device (X'Pert MRD manufactured by Philips Electronics) under the conditions of a Cuk$\alpha$ radiation as an X-ray source, an accelerating voltage of 45 keV, and a current value of 40 mA. The structure of a sample of which transmittance is measured is shown in 101 of FIG. 2A. 102 denotes a polycarbonate substrate which is a supporting substrate. 103 denotes an ITO thin film. The ITO thin film is deposited by DC sputtering using a composite oxide of $In_2O_3$—$SnO_2$ (ITO) as a sputtering target at a pressure of 0.8 Pa with the substrate temperature is kept at room temperature, i.e. under the condition that the substrate is not heated, in an argon atmosphere without introducing $O_2$ (oxygen flow rate=0%). The composite ratio (mass ratio) of the target material, $In_2O_3$:$SnO_2$ is 95:5 (% by mass). The ITO thin film 103 has a thickness of 150 nm. The ITO thin film has a transmittance of 22% as shown in FIG. 11. FIG. 12 shows a result of the X-ray diffraction measurement of an ITO thin film. In the diffraction pattern, a diffraction peak of a crystalline phase 1101 and a broad peak of an amorphous phase 1102 are observed. Thus, the ITO thin film is in a state where both the crystalline phase and the amorphous phase are present.

In the next heat treatment step, the conductive oxide is subjected to heat treatment using a laser beam. The conductive oxide absorbs light so as to generate heat, and then is thermally changed. Because the ITO thin film is in a state where both the crystalline phase and the amorphous phase are present, material difference between a part which has been irradiated with a laser beam (also referred to as a irradiated part) and a part which has not been irradiated therewith (also referred to as a non-irradiated part) can be largely changed, which will be specifically explained later.

In the first method for producing the conductive oxide-deposited substrate of the present invention shown in FIG. 2A, 104 denotes a heat treatment step. The heat treatment step is performed by heating the conductive oxide-deposited substrate with a laser beam. Namely, in the method for producing the conductive oxide-deposited substrate of the present invention, parts other than the irradiated part cannot be heated by using optical heating in the heat treatment.

105 denotes a direction of laser beam irradiation. 106 denotes a part in which the conductive oxide is thermally changed by irradiating with a laser beam. The thermal change appears in a change in the state of crystallization or change of composition of the conductive oxide.

In the method for producing the conductive oxide-deposited substrate of the present invention, a semiconductor laser is preferably used in the heat treatment step of thermally changing the conductive oxide. The power level of the semiconductor laser can be modulated at high speed by external control of driving current. Even a relatively inexpensive objective lens can condense a beam close to the diffraction limit of the laser beam so as to easily form a fine laser beam spot. Thus, the fine area irradiated with a laser beam in the conductive oxide can be thermally changed, thereby performing the heat treatment step effectively. As a laser beam source, for example, a blue laser beam having the wavelength of 360 nm to 420 nm can be used. At this time, an objective lens preferably has a numerical aperture (NA) of 0.85 to 0.95. By condensing the laser beam, the area irradiated with the laser beam can be further limited, so that the heat treatment step can be performed using the objective lens having a NA of 0.85 to 0.95. Particularly, the laser beam irradiation is preferably performed from the surface on which the conductive oxide 103 is deposited as shown in the direction of laser beam irradiation 105 of FIG. 2A, because a lens having a large numerical aperture (NA) can be used so as to form a fine structure, compared to the case where the conductive oxide is irradiated with a laser beam through the substrate from the supporting substrate side.

Figure 3:
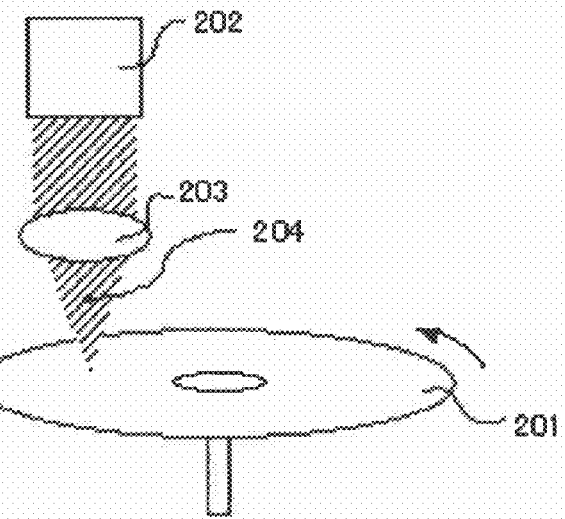
FIG. 3 is a view showing a step of subjecting a substrate to a heat treatment while being rotated in a method for producing a conductive oxide-deposited substrate of the present invention.

As shown in FIG. 3, a substrate may be irradiated with a laser beam, while being rotated. By irradiating the substrate with the laser beam while the substrate is being rotated at high speed, a wider area in the conductive oxide can be thermally changed at higher speed. In FIG. 3, 201 denotes a sample, which is a conductive oxide deposited in a thin layer on a supporting substrate. 202 denotes a laser beam source, 203 denotes an objective lens and 204 denotes a laser beam condensed with an optical system such as an objective lens 203.

As shown in FIG. 3, the sample 201 is irradiated with a laser beam while the sample 201 is rotated in a substantially vertical planar direction relative to the laser beam at high speed. Upon laser beam irradiation, the laser beam source is linearly moved in a radial direction, or the laser beam source is fixed and the rotating substrate is linearly moved. Such operation enables to irradiate the entire surface of the sample with the laser beam so as to form a pattern of spiral or concentrical arrays.

As an etching method used in an etching step, which is performed after the heat treatment step, as shown in FIG. 2A, a dry etching method can be used. The conductive oxide thin layer can be processed by a reactive ion etching method using HCl, HBr, $BCl_3$, $Cl_2$ or the like as an etching gas. As the etching method, a wet etching method is preferably used. In comparison with a dry etching method, a wet etching method enables to easily process the conductive oxide layer using inexpensive chemical substances, without using an expensive vacuum device. An etching step by the wet etching method is performed by immersing the substrate which has been subjected to the heat treatment step in an etching solution (etching liquid) so as to remove a non-irradiated part in the conductive oxide thin layer. A conductive oxide material of the laser irradiated part is crystallized or the composition of the material is changed, so that the resistance to the etching solution is improved, compared to that of the non-irradiated part. Thus, the laser irradiated part in the conductive oxide (hereinafter, also referred to as "a structure of conductive oxide") is remained by etching treatment, so as to form a structure of conductive oxide, as shown in 108 of FIG. 2A. Examples of the etching solution include acid aqueous solutions such as a hydrochloric acid solution ($HCl+H_2O$), a nitric acid solution ($HNO_3+H_2O$), an oxalic acid solution (($COOH)_2+ H_2O$), and a hydrofluoric acid solution ($HF+H_2O$). Alternatively, a mixed solution of these acid solutions may be used. The etching solution is selected depending on types and crystalline state of the conductive oxide material.

The structure 108 is in a state where the conductive oxide is thermally changed. The conductive oxide which has been deposited in a film deposition state having a low transmittance is thermally changed by laser beam irradiation in the heat treatment step. The thermally changed state is a state where the crystalline structure has high crystallinity as a result of the heat treatment step.

Figure 13:
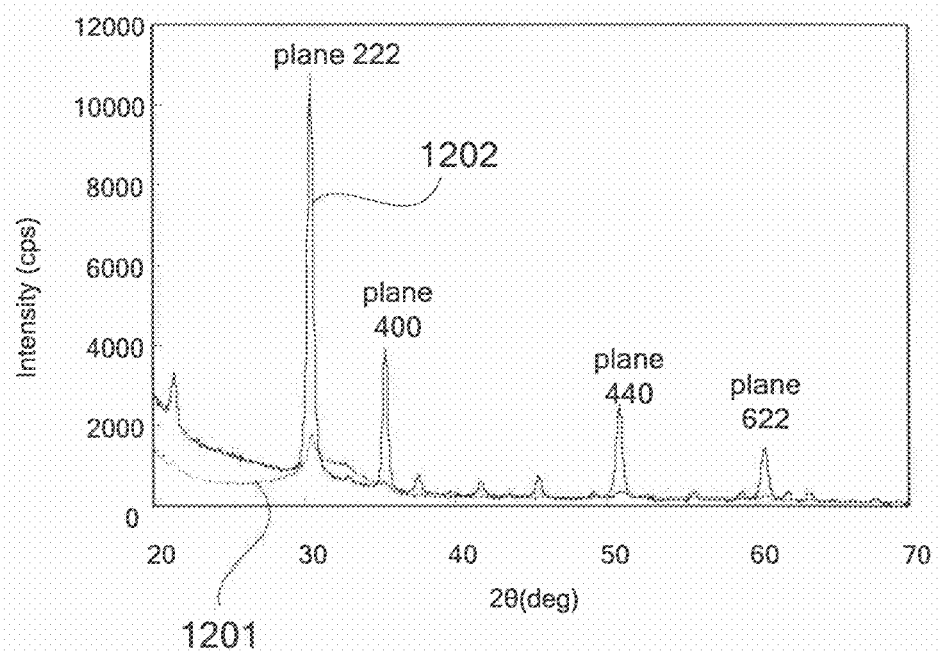
FIG. 13 is an X-ray diffraction pattern of an ITO thin film showing a comparison between a crystalline state of film deposition and that of after a structure is formed.

The crystallization by laser beam irradiation will be explained. A sample, which has been etched after film deposition and laser irradiation, is measured by an X-ray diffraction. The structure of the sample is shown in 101 of FIG. 2A. 102 denotes a polycarbonate substrate which is a supporting substrate. 103 denotes an ITO thin film. The ITO thin film is deposited by DC sputtering using a composite oxide of $In_2O_3$—$SnO_2$ (ITO) as a sputtering target at a pressure of 0.8 Pa with the substrate temperature kept at room temperature, i.e. under the condition that the substrate is not heated. The composite ratio (mass ratio) of the target material, $In_2O_3$:$SnO_2$ is 95:5 (% by mass). The ITO thin film 103 has a thickness of 150 nm. The ITO thin film has a transmittance of 22% as shown in FIG. 11, when it is deposited in an argon atmosphere without introducing $O_2$ (oxygen flow rate=0%). Next, the ITO thin film is irradiated with a laser beam by the method shown in 104 of FIG. 2A. The sample is irradiated with a laser beam from the surface on which the conductive oxide is deposited so as to be condensed on a sample surface as shown in the direction of laser beam irradiation 105 of FIG. 2A using a laser diode having a wavelength of 405 nm as a laser beam source and an objective lens having a numerical aperture (NA) of 0.85. The sample is irradiated with the laser beam, while being rotated as shown in FIG. 3. The rotational speed is 4.5 m/sec. When the sample is irradiated with the laser beam, the laser power level is modulated between 8 mW and 0.1 mW, and a pulse width, i.e. a time for maintaining the power of 8 mW is 11 nsec. In 104 of FIG. 2A, 106 is a thermally changed part in an ITO thin film by laser beam irradiation. 107 in FIG. 2A denotes an etching step. A sample irradiated with the laser is immersed in a hydrochloric acid aqueous solution (HCl+H$_2$O) as an etching solution so as to be etched. The etching temperature is room temperature, i.e. under the condition that the substrate is not heated, and the amount of HCl in the hydrochloric acid aqueous solution is 3.5% by mass. A part of the ITO thin film which has been irradiated with the laser beam is in higher crystalline state than that upon film deposition. The etching rate of a highly crystallized area is slower than the circumferential area. The conductive oxide-deposited substrate is immersed in the hydrochloric acid aqueous solution (etching solution) for 90 seconds, so that a part of the ITO thin film which is not irradiated with a laser beam is completely removed by etching, and a part of the ITO thin film which has been irradiated with the laser beam is remained, thereby processing the ITO thin film into a convex-shaped structure 108. FIG. 13 shows a result of X-ray diffraction measurements of an ITO thin film after film deposition (103 in FIG. 2A) and that of after forming a structure (108 in FIG. 2A). In FIG. 13, 1201 denotes a diffraction pattern of the ITO thin film after film deposition, and 1202 denotes a diffraction pattern of the ITO thin film which has been formed into a convex-shaped structure. The result of the diffraction pattern of the ITO thin film which has been processed into a convex shape 1202 is measured in a state where a plurality of structures are contained in an X-ray irradiated area. After film deposition, a broad peak of an amorphous phase is observed in 1201 similar to that as shown in FIG. 12. Thus, the ITO thin film is in a state where both the crystalline phase and the amorphous phase are present. On the other hand, a sharp diffraction peak is observed in the diffraction pattern of the ITO thin film which has been processed into a convex-shaped structure 1202. This result shows that the non-irradiated part of the ITO thin film in an amorphous phase state is etched away and that the laser-irradiated part of the ITO thin film in a polycrystalline state in which etching resistance is improved remains in a form of a convex-shaped structure even after etching treatment.

The conductive oxide material can be processed into a convex-shaped structure by a step of depositing a conductive oxide thin film having a decreased transmittance (101 in FIG. 2A), a step of crystallizing the conductive oxide thin film having a decreased transmittance by irradiating with a condensed laser beam (104 in FIG. 2A) and an etching step in which the non-irradiated part of the conductive oxide thin film is selectively removed by means of etching resistance difference between crystalline states (107 in FIG. 2A).

Figure 2B:
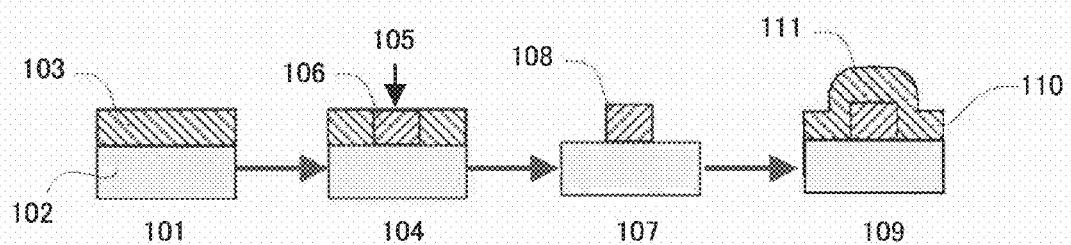
FIG. 2B is a view illustrating a second method for producing a conductive oxide-deposited substrate of the present invention.

FIG. 2B shows a method for producing a conductive oxide-deposited substrate of the present invention (the second production process).

101 denotes the first conductive oxide film deposition step, 104 denotes a laser beam irradiation step, and 107 denotes an etching step. The steps so far are the same as steps 101, 104 and 107 of the first production process shown in FIG. 2A. 109 in FIG. 2B denotes the second film deposition step. In the second film deposition step a conductive oxide thin layer is further deposited on a structure 108 of the conductive oxide, so as to obtain a structure 111 in which a convex shape is coated with a thin film 110. As the conductive oxide 110 which is laminated in the second film deposition step, various conductive oxide materials which contain oxide selected from In$_2$O$_3$, SnO$_2$, ZnO and Ga$_2$O$_3$ can be used. Examples thereof include In$_2$O$_3$—SnO$_2$(ITO), In$_2$O$_3$—SnO$_2$—ZnO (IZO), In$_2$O$_3$—ZnO—Al$_2$O$_3$ (AZO), ZnO—Ga$_2$O$_3$(GZO), and In$_2$O$_3$—ZnO—Ga$_2$O$_3$(IGZO). A sputtering method is used for film deposition. As a sputtering target, a target in which those oxides are mixed is used. Here, in order to compensate oxygen deficiency in the stoichiometric composition, film deposition is preferably performed in an atmosphere where oxygen gas is added to argon gas.

Figure 2C:
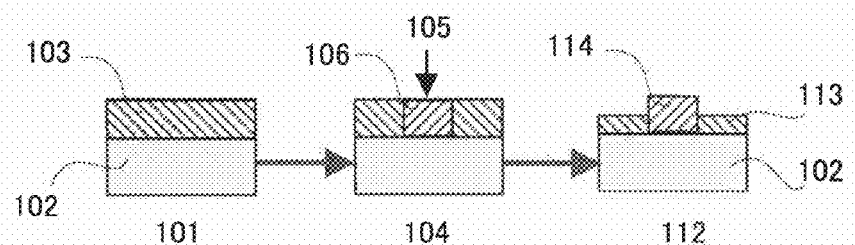
FIG. 2C is a view illustrating a third method for producing a conductive oxide-deposited substrate of the present invention.

FIG. 2C shows a method for producing a conductive oxide-deposited substrate of the present invention (the third production process). 101 denotes a conductive oxide film deposition step, and 104 denotes a heat treatment step. These steps are the same as those shown in FIG. 2A. 112 denotes an etching step. In the etching step 112, a part of the non-irradiated part of the conductive oxide thin layer, which is an area other than the area where a structure 114 is formed on the substrate 102, is removed, and then a residual part which is a much thinner conductive oxide thin layer 113 is remained on the substrate 102 by adjusting an etching time or the like in a solution etching (wet etching method). Thus, only an exposed part of the conductive oxide layer may be formed as a structure 114. That is, the entire surface of the structure 114 which is irradiated with a laser beam is not necessary to be exposed, but only a part (upper part) thereof may be exposed, and the other part (bottom part) thereof may be embedded in the much thinner conductive oxide thin layer 113 which has not been irradiated with the laser beam.

107 in FIG. 2A shows a non-irradiated part of the conductive oxide thin layer is completely removed from the substrate 102. 109 in FIG. 2B is a view of further laminating a conductive oxide thin film on a structure. Consequently, the structures are connected via the thin film. 112 in FIG. 2C is a view of terminating the etching of a conductive oxide in midstream. Consequently, the structures are connected via the thin film. The production process of FIGS. 2B and 2C enables to form a fine structure 111, 114 in a thin film conductive oxide. Because the structures are connected via the thin film, the structures are conductive and can be used as a surface electrode.

Examples of devices which need such surface electrode include solar batteries and illumination devices using solid light sources. These devices may have a structure in which a functional layer (a photoelectric conversion layer in the solar battery, and an emission layer in the illumination device) is laminated on a surface electrode of the conductive oxide.

A fine structure is contained in the surface electrode, so that the effective surface area of the functional layer deposited on the surface electrode is increased. The increase of the effective surface area is effective in improvement of the efficiency of the device. By setting the pitch of the structures from 200 nm to 500 nm, the effective surface area of the laminated functional layer is increased, and the antireflection effect can be obtained. The pitch of the structures means a distance between the centers of the adjacent structures. The pitch can be found by observing the structure by a scanning electron microscope (SEM), and then measuring a distance between the centers of the adjacent structures in the SEM image as shown with 705 in FIG. 7.

It is know that in a light emitting and receiving device, structures having a pitch which is less than or equal to a wavelength pitch are provided, so as to control light such as antireflection effect. The pitch of the structures which is effective at the wavelength of visible light is 200 nm to 500 nm. This is an optimal pitch range of the structures which can be formed according to the present invention, but not limiting thereto. According to the present invention, in the light emitting and receiving device, the substrate, in which the structure is formed in the conductive oxide used as a transparent electrode, can be provided.

(A Method for Producing a MIS Laminated Structure and a MIS Laminated Structure)

A method for producing a MIS laminated structure by laser beam irradiation and etching treatment, including (a) depositing a semiconductor material layer S, an insulating material layer I, and a conductive oxide material layer M in this order over a supporting substrate so as to form the MIS laminated structure; (b) subjecting the MIS laminated structure to heat treatment by irradiating with a condensed laser beam from the conductive oxide material layer side so as to thermally change a part of the conductive oxide material layer, and to thermally change a part of the semiconductor material layer by heat spread in the MIS laminated structure; (c) subjecting the MIS laminated structure to etching treatment so as to remove a part which has not been thermally changed, and other steps as necessary, wherein the conductive oxide thin film absorbs the laser beam, and at least a part of the conductive oxide thin film is an amorphous phase.

The MIS laminated structure of the present invention is produced by the method for producing a MIS laminated structure of the present invention, and contains a supporting substrate, and a MIS laminated structure in which is at least a semiconductor material S, an insulating material I, and a conductive oxide material M is deposited in this order over the supporting substrate.

Hereinafter, the present invention will be explained with reference to the drawings.

Figure 15A:
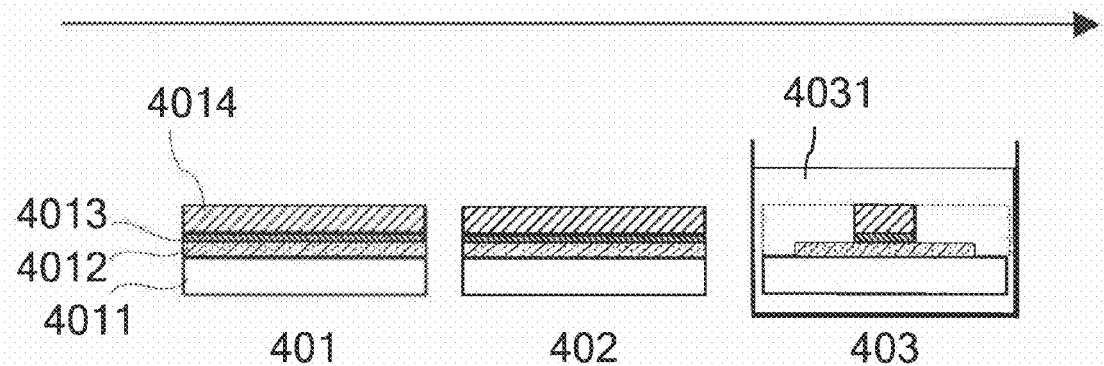
FIG. 15A is a frame format showing a step of forming a MIS laminated structure performed in an arrow direction.

FIG. 15A is a frame format showing a method for producing a MIS laminated structure of the present invention.

In FIG. 15A, 401 denotes a film deposition step (a).

4011 denotes a supporting substrate. As a material of the supporting substrate 4011, for example, glass, quartz or silicon can be used. Additionally, a plastic substrate can be used. Examples of the materials for the plastic substrates include polycarbonate, acrylic resins and polyethylene terephthalate (PET).

4012 denotes a semiconductor material layer S (semiconductor). As a material for the semiconductor material layer, a material which can be etched away by an acid solution is used. Oxide materials such as zinc oxide (ZnO), tin oxide ($SnO_2$) or the like can be used. Additionally, other metal oxides such as $In_2O_3$ and $Ga_2O_3$ may be contained in zinc oxide (ZnO). For example, InGaZnO ($In_2O_3$:$Ga_2O_3$:ZnO=1:1:1) may be used. For film deposition of the semiconductor material, a sputtering method can be used. The semiconductor material layer preferably has a thickness of 20 nm to 200 nm.

4013 denotes an insulating material layer I (insulator). As an insulating material, a thin film of ZnS, $SiO_2$, SiON, $Si_3N_4$, or a mixture thereof can be used. For example, an insulating material which is a mixture of zinc sulfide and silicon oxide (ZnS—$SiO_2$) may be used. For film deposition of the insulating material, a sputtering method can be used. The insulating material layer preferably has a thickness of 5 nm to 50 nm.

4014 denotes a conductive oxide material layer M (metal). As a conductive oxide material, $In_2O_3$, $SnO_2$, $In_2O_3$—$SnO_2$ (ITO) can be used. Additionally, a material in which metal element such as Al, Ga, Zn or the like is added in each of these conductive oxide materials may be used. For film deposition of the conductive oxide material, a sputtering method can be used. The conductive oxide material layer preferably has a thickness of 50 nm to 200 nm.

Generally, when a conductive oxide material is deposited by a sputtering method, a reactive sputtering method, in which film deposition is performed in an atmosphere where oxygen gas is added to argon gas, is used in order to compensate oxygen deficiency in the stoichiometric composition. However, in this embodiment, since a conductive oxide material layer having less oxygen than that of stoichiometric composition, i.e. oxygen deficiency, is formed, film deposition is preferably performed in an argon gas atmosphere without adding oxygen gas. The conductive oxide material layer has oxygen deficiency, so that the transmittance is decreased and light absorption ability increases. The conductive oxide thin film preferably has a transmittance of 10% to 30% at a wavelength of 400 nm. The transmittance of the conductive oxide material such as $In_2O_3$, $SnO_2$, $In_2O_3$—$SnO_2$ (ITO) can be easily controlled by performing sputtering film deposition only in an argon gas atmosphere. Therefore, these materials are suitably used in a processing method using heat by laser beam irradiation in the present invention.

Thus, in a film deposition step shown in FIG. 15A, the semiconductor material layer 4012, the insulating material layer 4013 and the conductive oxide material layer 4014 are deposited, for example, successively deposited and laminated, in this order so as to produce a MIS laminated structure.

FIG. 15A, 402 denotes a laser beam irradiation step (b). In the laser beam irradiation step (b), a part of the conductive oxide material layer M is thermally changed by irradiating with a condensed laser beam (light) from the conductive oxide material layer side while modulating the power level, and a part of the semiconductor material layer S is thermally changed by heat spread in the MIS laminated structure. As a laser beam source, a blue laser beam having the wavelength of 360 nm to 420 nm can be used. An objective lens preferably has a numerical aperture (NA) of 0.65 to 0.95. Upon a timing of modulation of a laser beam power level, the laser beam power level is modulated depending on a location where a shape of the MIS laminated structure is formed.

Figure 16:
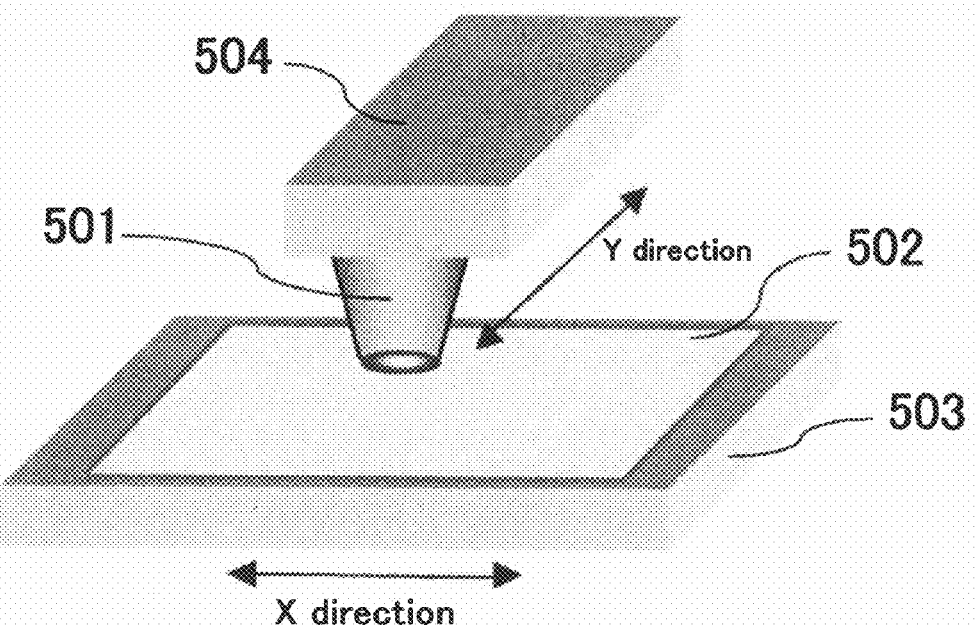
FIG. 16 is a conceptual view of an example of a laser beam irradiation device (a stage for placing a sample scanning in X direction, and an optical pick-up scanning in Y direction) used in a laser beam irradiation step of the present invention.

FIG. 16 is a conceptual view of an example of a laser beam irradiation device (a stage for placing a sample scanning in X direction, and an optical pick-up scanning in Y direction) used in the laser beam irradiation step of the present invention.

In FIG. 16, 501 denotes a laser beam source. As the laser beam source, a semiconductor laser is preferably used. The power level of the semiconductor laser can be modulated at high speed by external control of driving current. A relatively inexpensive objective lens can condense a beam close to the diffraction limit of the laser beam so as to easily form a fine laser beam spot. Thus, the fine area irradiated with a laser beam in the conductive oxide can be thermally changed so as to perform the heat treatment step effectively.

502 denotes a sample, 503 denotes a stage for placing a sample, and 504 denotes a stage for mounting an optical pick-up. The stage for placing a sample 503 can scan a sample in X direction, and the speed of scanning in X direction can change, for example, from 0.1 m/sec to 1 m/sec. The stage for mounting an optical pick-up can scan a sample in Y direction, and has a resolution of moving in Y direction of approximately several nanometers.

Figure 20:
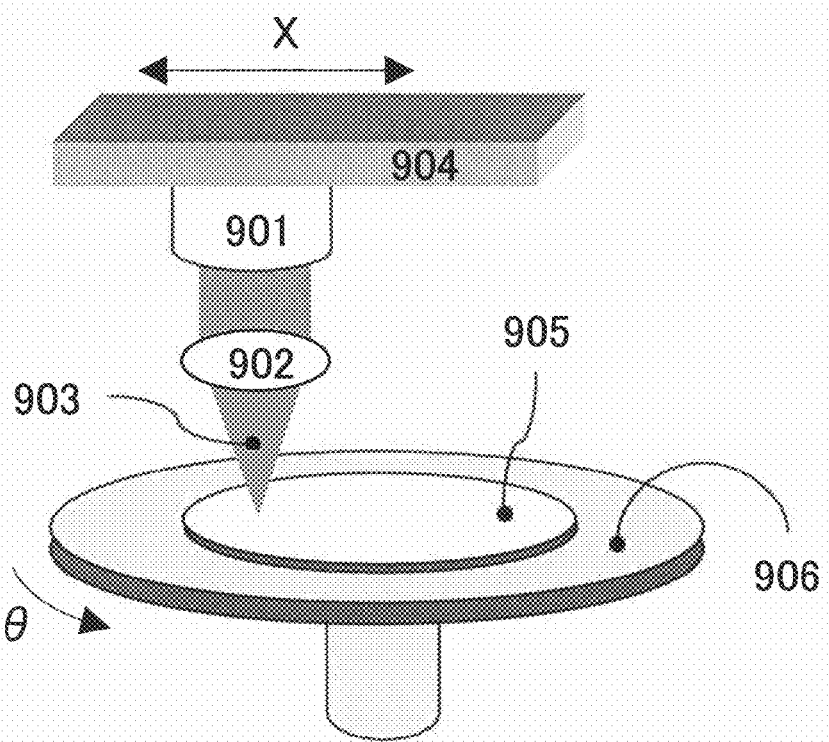
FIG. 20 is a conceptual view of an example of a laser beam irradiation device (a stage for placing a sample rotating in θ direction, and an optical pick-up scanning in X direction) used in a laser beam irradiation step.

Alternatively, a sample may be irradiated with a laser beam by rotating the stage for placing a sample, while the sample is scanned by the stage for mounting an optical pick-up scan in X direction. FIG. 20 is a conceptual view of an example of a laser beam irradiation device (a stage for placing a sample rotating in θ direction, and an optical pick-up scanning in X direction). In FIG. 20, 901 denotes a laser beam source. As the laser beam source, the same one as used in the laser irradiation device by scanning in X-Y direction can be used. 902 denotes an objective lens, and 903 denotes a condensed laser beam, 904 denotes a stage for mounting an optical pick-up. The stage for mounting an optical pick-up can scan a sample in X direction.

905 denotes a sample, 906 denotes a stage for placing a sample. The stage for placing a sample 906 can rotate in θ direction. The rotation speed can change, for example, from 0.1 m/sec to 10 m/sec. The entire surface of a sample can be spirally irradiated with a laser beam by combining X-scan in the stage for mounting an optical pick-up 904 with θ-scan in the stage for placing a sample 906.

Using a method for scanning with regard to a given position of X-Y with a laser beam, or a method for scanning with regard to a given position of X-θ with a laser beam by means of two-axis stage scanning, the MIS laminated structure, i.e. a part of the conductive oxide material layer is thermally changed by modulating the power level, and a part of the semiconductor material layer is thermally changed by heat spread in the MIS laminated structure.

403 in FIG. 15A denotes an etching treatment step (c), in which a part of the MIS laminated structure which has not been thermally changed is removed by etching treatment so as to form the MIS laminated structure. In the etching treatment step (c), an easy and simple wet etching can be used.

Examples of the etching solution 4031 include acid aqueous solutions such as a hydrochloric acid solution ($HCl+H_2O$), a nitric acid solution ($HNO_3+H_2O$), an oxalic acid solution (($COOH)_2+H_2O$), and a hydrofluoric acid solution ($HF+H_2O$). Alternatively, a mixed solution of these acid solutions may be used. The etching solution is selected depending on types and crystalline state of the conductive oxide material. The treatment may be performed at room temperature (i.e. under no heating condition), or under the condition of heating a solution at several tens of degrees Celsius.

Figure 15B:
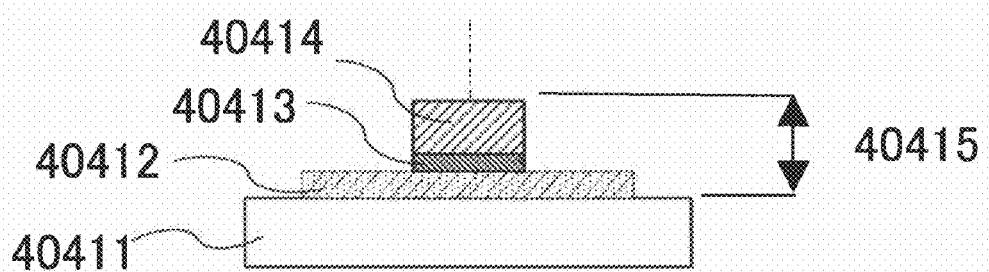
FIG. 15B shows a cross sectional view of an example a MIS laminated structure which has been subjected to wet etching treatment according to the present invention.
Figure 15C:
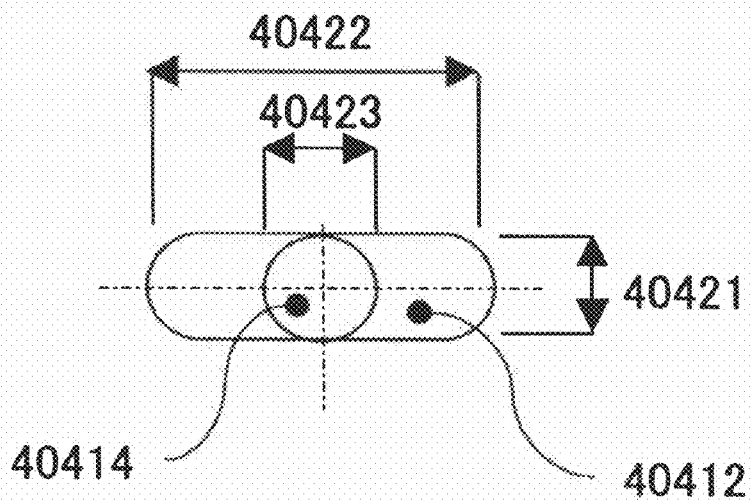
FIG. 15C shows a top view of the MIS laminated structure as seen from the top surface.

By the method for producing a MIS laminated structure of the present invention, as described in the etching treatment step (c), a MIS laminated structure is formed by removing a part of the MIS laminated structure which has not been thermally changed by wet etching. FIGS. 15B and 15C show a shape of a MIS laminated structure which has been subjected to wet etching. FIG. 15B shows a cross sectional view of an example of the MIS laminated structure as seen from a side. FIG. 15C shows a top view of the MIS laminated structure.

40411 denotes a supporting substrate, 40412 denotes a semiconductor material layer, 40413 denotes an insulating material layer and 40414 denotes a conductive oxide material layer, and form a MIS laminated structure. As each constituting material, the same as the above described materials and the like are used.

The processed size of the semiconductor material layer 40412 is larger than that of the conductive oxide material layer 40414.

Because a condensed laser beam is used, the structure of the conductive oxide 40414 is in the shape of circle or ellipse, and the structure of the semiconductor material 40412 is in the shape of ellipse or has curved ends. That is, the processed part of the MIS laminated structure is in the shape of substantially circle or oval.

40421 denotes a width of the structure, for example, in a range of 0.3 μm to 1 μm. 40422 denotes a length of the semiconductor material area, for example, in a range of 0.5 μm to 5 μm. 40423 denotes a length of the conductive oxide area and insulating material area, for example, in a range of 0.1 μm to 2 μm. When the switching element is formed from the MIS laminated structure, the length of conductive oxide area 40423 corresponds to a gate length. 40415 denotes a height of the structure, for example, in a range of 100 nm to 500 nm.

The principle of the method for producing the MIS laminated structure of the present invention is summarized in FIGS. 22A and 22B.

FIG. 22A shows the characteristics of the shape of a MIS laminated structure. The MIS laminated structure is a laminated structure consisting of a conductive material (conductive oxide material) layer M which is an upper layer M of a conductive oxide material (metal), an insulating material layer I which is an intermediate layer I of an insulating material (insulator), and a semiconductor material layer S which is an under layer S of a semiconductor material (semiconductor).

In the MIS laminated structure, a region of the semiconductor material layer as the under layer is larger than a gate region 32 consisting of a conductive oxide material layer and an insulating material layer as the upper layer.

This is because a contact area of a source region 31 on which a source electrode contacts and a drain region 33 on which a drain electrode contacts are necessary to be provided in the semiconductor material layer on the substrate 30, as a cross sectional view of an element structure shown in FIG. 22B.

FIG. 22A also shows the characteristics of the method for producing a MIS laminated structure, such as constituent materials of the MIS lamination layer, i.e. an oxide laminated structure, laser beam absorption ability, and the like. A conductive oxide material layer having poor transmittance due to oxygen deficiency is deposited as the upper layer of the MIS laminated structure, so that a structure consisting of the MIS lamination layer which is a basic structure of a switching element can be formed by an easy and simple method of laser beam irradiation and etching treatment.

FIG. 22A also shows difference of the heat accumulation states in each layer in the laser beam irradiation step. In the method for producing the MIS laminated structure of the present invention, a part of the conductive oxide material layer is thermally changed, and a part of the semiconductor material layer is thermally changed by heat spread in the MIS laminated structure. That is, heat tends to be accumulated in the under layer rather than in the upper layer which is closer to laser beam source than the under layer, because the MIS laminated structure is a laminated constitution. Thus, the heat generated by laser irradiation is accumulated in the under layer so as to thermally change a part of the semiconductor material layer. FIG. 22A also shows selectivity to an etching solution. A material having a selectivity to the hydrochloric acid aqueous solution used in the wet etching treatment is used in the upper layer of the conductive oxide material layer and the under layer of the semiconductor material layer, and a material having no selectivity used in the insulating material.

FIG. 22A also shows a processed shape. As shown in FIGS. 15A to 15C, the thermally changed parts in the conductive oxide material layer as the upper layer and the semiconductor material layer as the under layer can be patterned in a convex shape. The thermally changed area in the semiconductor material layer of the under layer is spread by heat accumulation and heat diffusion, and the patterned area in the semiconductor material layer of the under layer is larger than that of the upper layer. Moreover, because a material of the insulating material layer as the intermediate layer does not have etching selectivity, the insulating material layer can be processed into a pattern having the same size as that of the conductive material layer while the conductive material layer of the upper layer serves as an etching mask. As a result, a structure of the MIS laminated structure as shown in FIG. 22B can be produced by only one laser beam irradiation and wet etching treatment.

Figure 17:
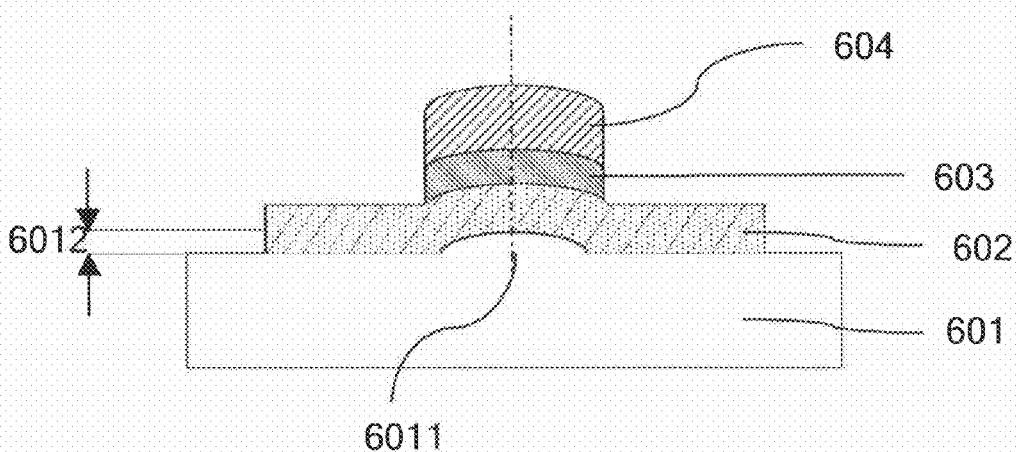
FIG. 17 is a schematic cross sectional view showing a shape of a MIS laminated structure in which a supporting substrate has a convex-shaped part on a surface thereof, on which the MIS laminated structure is produced according to the present invention.

FIG. 17 shows a schematic cross sectional view showing a shape of a MIS laminated structure in which a supporting substrate has a convex-shaped part on a surface thereof, on which the MIS laminated structure is produced.

In FIG. 17, 60 denotes a cross sectional view of a MIS laminated structure.

601 denotes a supporting substrate of a plastic material (polycarbonate) in the MIS laminated structure 60. 6011 denotes a convex part formed on a surface of the polycarbonate substrate. 6012 denotes a height of the convex part. The height of the convex part is 10 nm to 50 nm.

602 denotes a semiconductor material layer on which a pattern is formed by the laser irradiation step and etching treatment step. As the semiconductor material layer, the same material as described above is used. 603 denotes an insulating material layer which is patterned by the process. As the insulating material layer, the same material as described above is used. 604 denotes a conductive oxide material layer which is patterned by the process. As the conductive oxide material layer, the same material as described above is used.

Upon the timing of modulation of laser beam power level in the laser beam irradiation step, the laser beam power level is modulated at three levels, i.e. a low level, a middle level, and a high level.

As shown in FIG. 17, when an element structure consisting of the MIS laminated structure is formed, the center of the structure is irradiated with a laser beam at a high power level. As a result, a surface of the plastic substrate located in the center of the structure can be formed in a convex shape by heat spread in the MIS laminated structure. That is, an element structure consisting of the MIS laminated structure is formed on the plastic substrate having a convex shape 6011 formed on a surface thereof depending on condition of the power level of laser beam irradiation as shown in 6011 of FIG. 17. The shape of the MIS laminated structure can be different from that produced by a process using the conventional photolithography.

Next, a method for producing a switching element from a MIS laminated structure will be explained.

A switching element can be preferably produced by a method for producing a switching element including (d) a step of depositing a conductive oxide material layer M2 on the MIS laminated structure, (e) a step of irradiating the conductive oxide material layer M2 with a laser beam from the conductive oxide material layer side so as to thermally change in part, and (f) a step of subjecting the conductive oxide material layer M2 to a wet etching treatment so as to remove a part which has not been thermally changed, thereby forming an electrode, such as a source electrode, a drain electrode and the like. The method for forming an electrode is not particularly limited, for example, a switching element structure can be produced by forming source and drain electrodes using a is process of typical photolithography and etching treatment, and a process of inkjet printing.

Figure 18A:
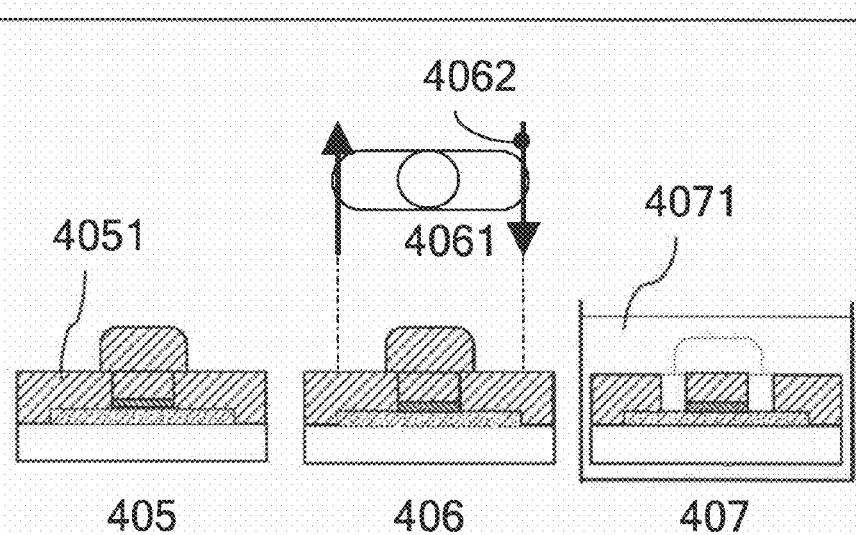
FIG. 18A is a frame format showing a step of forming an electrode on a MIS laminated structure of the present invention performed in an arrow direction.

FIG. 18A is a frame format showing a step of forming electrodes (a source electrode and a drain electrode) on a MIS laminated structure so as to form a switching element of the present invention.

FIG. 18A, 405 denotes a step of depositing a conductive oxide material layer M2. 4051 denotes a conductive oxide material layer M (metal).

As the conductive oxide material, a material containing any one of $In_2O_3$, $SnO_2$ and $ZnO$ is preferably used similar to the conductive oxide material layer M in the MIS laminated structure. Examples thereof include $In_2O_3$—$SnO_2$ (ITO) and $In_2O_3$—$SnO_2$—$ZnO$ (IZO). For film deposition, a sputtering method can be used. The conductive oxide material layer preferably has a thickness of 50 nm to 200 nm. As an oxide material for forming the conductive oxide material layer, $In_2O_3$—$SnO_2$ (ITO) having oxygen deficiency is preferably used. Similar to the conductive oxide material layer M of the MIS laminated structure, a conductive oxide material layer having less oxygen than that of stoichiometric composition, i.e. in an oxygen deficiency state, is preferably deposited by sputtering in an argon atmosphere.

In FIG. 18A, 406 denotes a laser beam irradiation step (e).

In the laser beam irradiation step (e), the conductive oxide is material layer M2 is irradiated with a condensed laser beam (light) by modulating the power level from the conductive oxide material layer side so as to thermally change a part of the conductive oxide material layer M2. The same laser beam source as in the laser beam irradiation step (b) in the method for forming the switching element structure is used.

4061 in FIG. 18A denotes a view seen from top (top view) of the structure in which the conductive oxide material layer M2 is deposited in the film deposition step (d).

4062 denotes a scanning direction of a structure by a laser beam as seen from the top surface. Upon a timing of modulation of laser beam power level in the laser beam irradiation step, the laser beam power level is modulated depending on a location where source and drain electrodes are formed (for example, two levels). The same laser irradiation device (FIG. 16) used in the formation of the switching element structure can be used. A laser beam is scanned with regard to a given position in X-Y direction, so that the conductive oxide having source and drain electrodes are thermally changed (thermal alteration) by modulating the power level.

407 in FIG. 18A denotes an etching treatment step, i.e. wet etching treatment step (f) of subjecting a conductive oxide material layer M2 to wet etching so as to remove a part of the conductive oxide material layer M2 which has not been thermally changed, thereby forming electrodes (a source electrode and a drain electrode). In the wet etching in the etching treatment step (f), an acid solution is preferably used as an etching solution.

Similar to the etching treatment step (c) of the switching element structure, as an etching solution 4071, acid aqueous solutions such as a hydrochloric acid solution ($HCl+H_2O$), a nitric acid solution ($HNO_3+H_2O$), an oxalic acid solution (($COOH)_2+H_2O$), a hydrofluoric acid solution ($HF+H_2O$) or the like can be used. Alternatively, a mixed solution of these acid solutions may be used. The etching solution is selected depending on types and crystalline state of the conductive oxide material. The treatment can be performed at room temperature (i.e. under no heating condition), or under the condition of heating a solution at several tens of degrees Celsius. Thus, by the above-described production method, the source and drain electrodes can be formed in the MIS laminated structure.

Figure 18B:
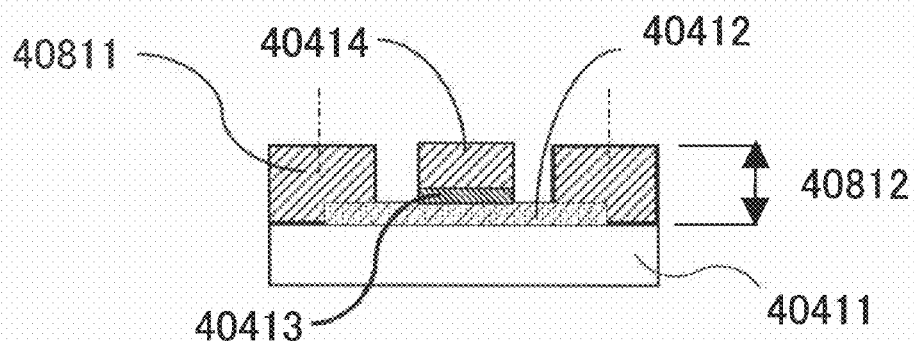
FIG. 18B is a side cross sectional view showing a state where an electrode is formed on the MIS laminated structure.
Figure 18C:
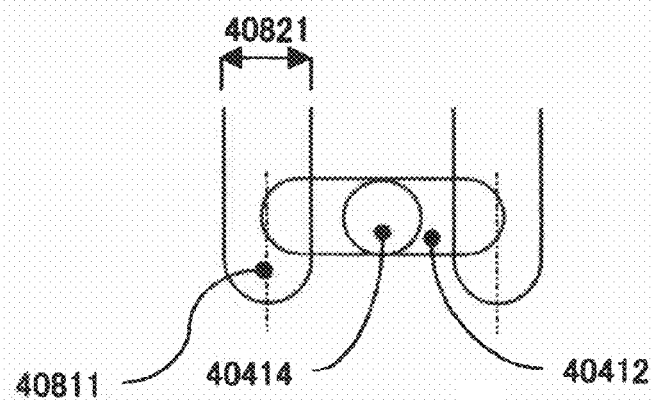
FIG. 18C is a top view of the MIS laminated structure.

FIG. 18B shows a side cross sectional view of a MIS laminated structure, in which a source and a drain electrode are formed, and FIG. 18C shows a top view of the MIS laminated structure.

40811 denotes electrodes (a source electrode and a drain electrode) consisting of a conductive oxide material. The conductive oxide material is the same as that used in the MIS laminated structure. The source and drain electrodes are formed in contact with a semiconductor area 40412. The MIS laminated structure is formed by a condensed laser beam, so that the edges of the MIS laminated structure are curved, so-called a circular arc-shape as shown in FIG. 18C. 40821 denotes a width of the source and drain electrodes, for example, in a range of 0.5 μm to 2 μm. 40812 denotes a height of the source and drain electrodes, for example, in a range of 100 nm to 500 nm, which is substantially the same as that of the MIS laminated structure shown in 40415 in FIG. 15B.

EXAMPLES

Hereinafter, with referring to Examples and Comparative Examples, the present invention is explained in detail and the following Examples and Comparative Examples should not be construed as limiting the scope of the present invention.

Examples A1 to A4 illustrate production examples of conductive oxide-deposited substrates. Example A5 shows a method for processing various types of conductive oxide materials

Example A-1

Figure 4:
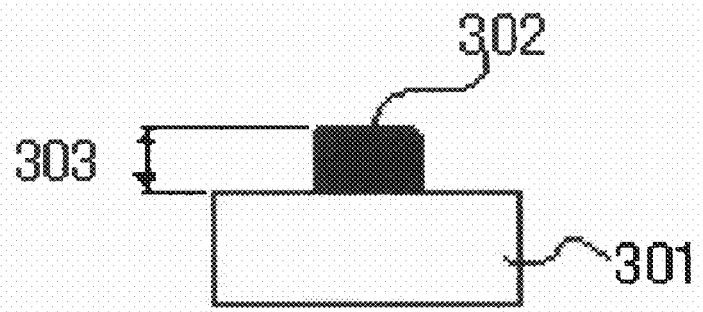
FIG. 4 is a cross sectional view of an example of a conductive oxide-deposited substrate which is obtained by a method for producing a conductive oxide-deposited substrate of the present invention.

FIG. 4 is a cross sectional view of an example of a conductive oxide-deposited substrate of the present invention. 301 and 302 respectively denote a supporting substrate and a structure of conductive oxide. The structure 302 is a structure in which a conductive oxide is thermally changed through a heat treatment step and an etching treatment step after a film deposition step. 303 denotes a height of the structure.

Figure 5:
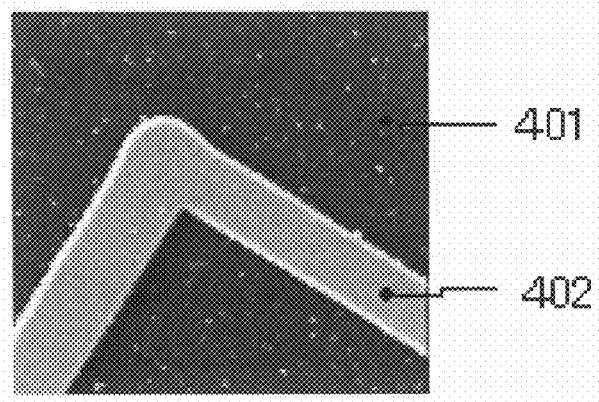
FIG. 5 is an SEM image of a surface of the conductive oxide-deposited substrate shown in FIG. 4.

FIG. 5 is a scanning electron microscope (SEM) image of a surface of the conductive oxide-deposited substrate shown as the cross sectional view in FIG. 4. 401 denotes a surface of a supporting substrate in which a conductive oxide is removed by etching and then the surface of the substrate is exposed. 402 denotes a structure of the conductive oxide and a conductive part (structure) having a line width of approximately 1 μm.

A method for producing the conductive oxide-deposited substrate shown in FIGS. 4 and 5 will be explained on the basis of FIG. 2A.

In FIG. 2A, 101 denotes a conductive oxide film deposition step. Quartz was used as a supporting substrate 102, and a conductive oxide layer 103 was an ITO thin film. The ITO thin film was deposited by sputtering using $In_2O_3$—$SnO_2$ (ITO) as a sputtering target in an argon (Ar) atmosphere at a pressure of 0.8 Pa with the substrate temperature kept at room temperature, i.e. under the condition that the substrate was not heated. The conductive oxide thin layer 103 had a thickness of 100 nm.

In this Example, film deposition was performed only in an argon atmosphere without introducing $O_2$. The transmittance of the ITO thin film deposited under the above-described conditions was measured by a UV-VIS Spectrophotometer (UV-2500(PC)SGLP manufactured by Shimadzu corporation). The ITO thin film had a transmittance of 28% at a wavelength of 400 nm. It was confirmed that the ITO thin film was in a state that it absorbed a laser beam.

By setting such condition, an ITO thin film which absorbed an irradiated beam and was thermally changed was produced. In a heat treatment step 104, a sample was irradiated with a laser beam from a film surface of the sample, i.e. from a surface in which a conductive oxide film was formed on the substrate so as to be condensed thereon using a laser diode having a wavelength of 405 nm. Upon irradiation, laser power level was kept at constant and a stage on which the sample was placed was scanned with a laser in an X-Y axis direction so that the ITO thin film 103 was thermally changed to a line shape. The sample was a conductive oxide-deposited substrate in which $In_2O_3$—$SnO_2$ (ITO) having a 100 nm-thick was deposited on a quartz substrate.

In an etching step 107, a sample heated by the laser was immersed in a hydrochloric acid aqueous solution (HCl+$H_2O$) as an etching solution so that the sample was etched. The etching temperature was room temperature, i.e. under the condition that the substrate was not heated, and the amount of HCl in the hydrochloric acid aqueous solution was 3.5% by mass. Apart of the ITO thin film which had been irradiated with the laser beam was in higher crystalline state than that upon film deposition. The etching rate of a highly crystallized area was slower than the circumferential area.

The conductive oxide-deposited substrate was immersed in the hydrochloric acid aqueous solution (etching solution) for 90 seconds, so that a part of the ITO thin film which was not irradiated with a laser beam was completely removed by etching, and a part of the ITO thin film which had been irradiated with the laser beam was remained, thereby forming a line pattern of the ITO thin film shown in FIG. 5.

Example A-2

Figure 6:
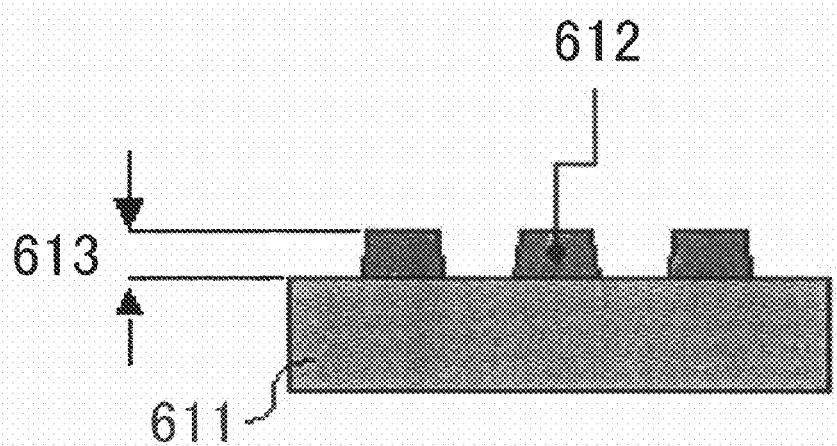
FIG. 6 is a cross sectional view of another example of a conductive oxide-deposited substrate which is obtained by a method for producing a conductive oxide-deposited substrate of the present invention.

FIG. 6 shows a cross sectional view of a conductive oxide-deposited substrate of the present invention. 611 denotes a supporting substrate, 612 denotes a structure of a conductive oxide. The structure was a structure in which a conductive oxide had been thermally changed. 613 denotes a height of the structure.

Figure 7:
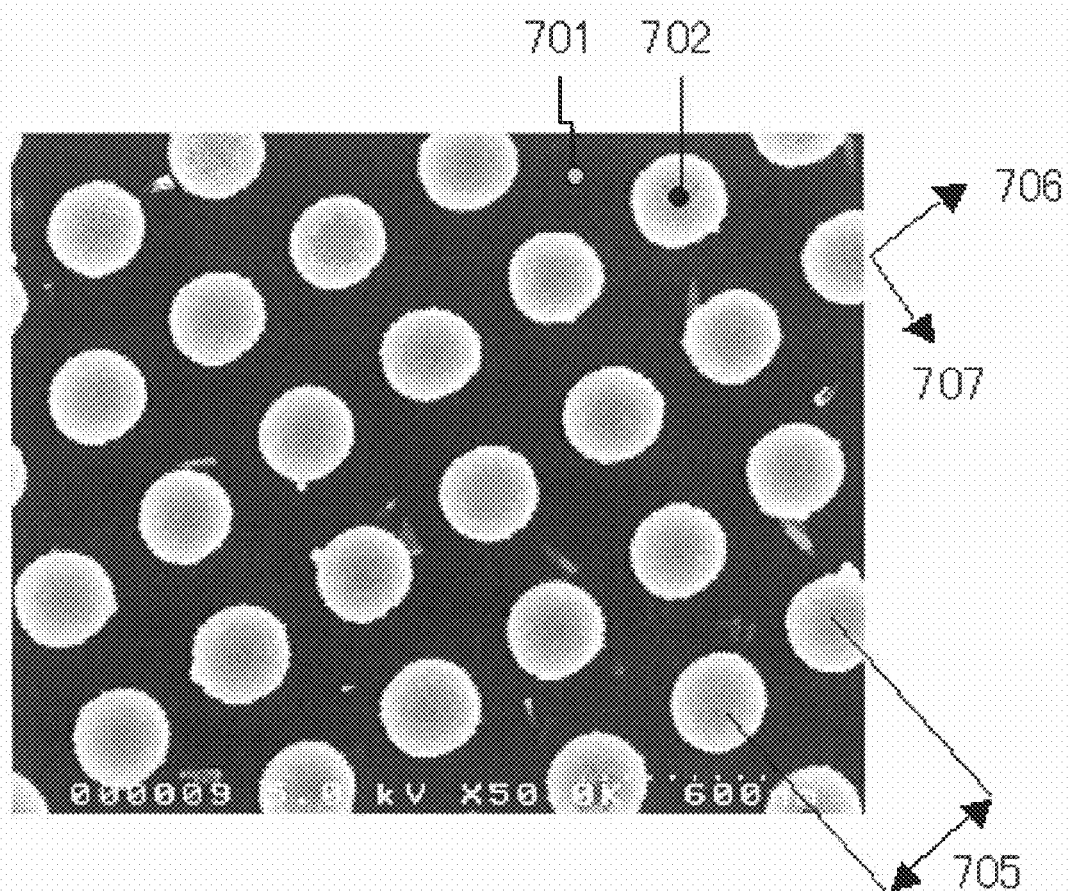
FIG. 7 is an SEM image of a surface of the conductive oxide-deposited substrate shown in FIG. 6.

FIG. 7 is an SEM observation image of a surface of the conductive oxide-deposited substrate shown as the cross sectional view in FIG. 6. 701 denotes a substrate surface in which a conductive oxide is removed by etching and then the surface of the substrate is exposed. 702 denotes a structure of the conductive oxide. The structure had a diameter of 250 nm and a height of 150 nm. A pitch 705 of the structures was 400 nm. When the shape of the top surface of the structure (a specific shape) was formed by a laser beam, they were formed into circle or ellipse depending on production methods.

The structures were placed in circumferential arrays on the substrate. 706 denotes a circumferential direction and 707 denotes a radial direction (an orthogonal direction to the circumferential direction).

A method for producing the conductive oxide-deposited substrate shown in FIGS. 6 and 7 will be explained on the basis of FIG. 2A.

In FIG. 2A, 101 denotes a conductive oxide film deposition step. Polycarbonate was used as a supporting substrate 102, and a conductive oxide thin layer 103 was an ITO thin film. The ITO thin film was deposited by sputtering using $In_2O_3$—$SnO_2$ (ITO) as a sputtering target in argon (Ar) atmosphere at a pressure of 0.8 Pa with the substrate temperature kept at room temperature, i.e. under the condition that the substrate was not heated. The conductive oxide layer 103 had a thickness of 150 nm.

The ITO thin film, which absorbed an irradiated laser beam so as to be thermally changed, was deposited using only an argon gas without introducing $O_2$. The transmittance of the ITO thin film deposited under the above-described conditions was measured by a UV-VIS Spectrophotometer (UV-2500 (PC)SGLP manufactured by Shimadzu corporation). The ITO thin film had a transmittance of 22% at a wavelength of 400 nm. It was confirmed that the ITO thin film was in a state that it absorbed a laser beam.

In a heat treatment step 104, a sample was irradiated with a laser beam from the side of a film surface of the sample as shown in 105 so as to be condensed on the substrate using a laser diode having a wavelength of 405 nm and an objective lens having a numerical aperture (NA) of 0.85. The sample was irradiated with the laser beam, while being rotated as shown in FIG. 3. The rotational speed was 4.5 m/sec. When the sample was irradiated with the laser beam, the laser power level was modulated between 8 mW and 0.1 mW, and a pulse width, i.e. a time for maintaining the power of 8 mW was 11 nsec.

Under such conditions, the power of the laser beam was modulated, so that a part of the ITO thin film irradiated with the laser beam was thermally change to a circular shape. 107 denotes an etching step. The etching step was performed in which a sample irradiated with the laser was immersed in a hydrochloric acid aqueous solution (HCl+H$_2$O) so as to be etched. The etching temperature was room temperature, i.e. under the condition that the substrate was not heated, and the amount of HCl in the hydrochloric acid aqueous solution was 3.5% by mass. The sample was immersed in the hydrochloric acid aqueous solution (etching solution) for 90 seconds so as to form an ITO patterns (structures) in which circular shaped structures were placed in circumferential arrays as shown FIG. 7.

Example A-3

Figure 8:
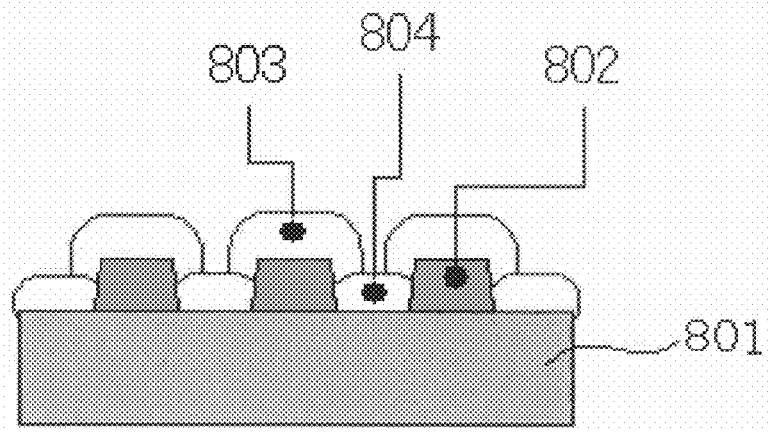
FIG. 8 is a cross sectional view of showing another example of a conductive oxide-deposited substrate of the present invention.

FIG. 8 is a state in which another ITO thin film is laminated on the ITO pattern (structures) shown in FIG. 7. 801 denotes a supporting substrate of polycarbonate, 802 denotes a structure of ITO, 803 denotes an ITO thin film limited on the structure and 804 denotes a connecting portion between the structures of ITO thin film.

Figure 9:
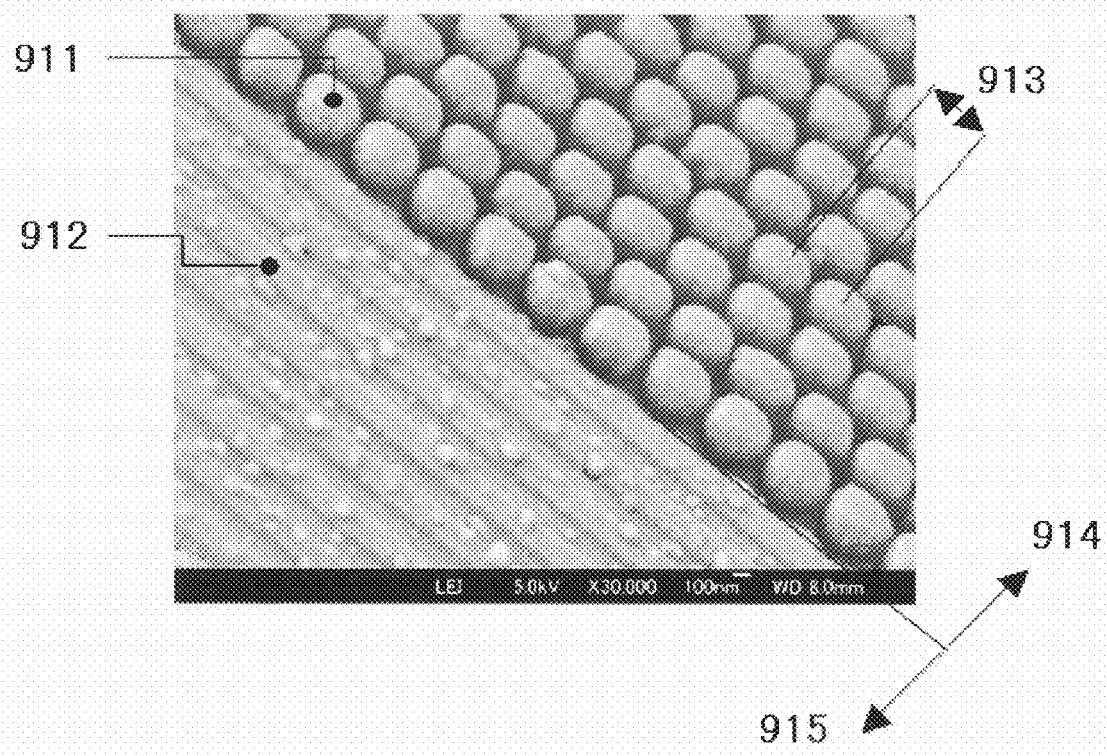
FIG. 9 is an SEM image of a surface shape of another conductive oxide-deposited substrate shown in FIG. 8 taken in an oblique direction, which includes circle or elliptical parts 911 as structures and a ITO thin film 912 formed in a planar or line shape.

FIG. 9 is a SEM observation image of the conductive oxide-deposited substrate from an oblique direction, which is shown as the cross sectional view in FIG. 8. 911 denotes a structure of ITO, and 912 denotes an ITO thin film. The pitches of the structures 913 were 400 nm. The structure had a diameter of 370 nm and a height of 150 nm. 914 denotes an area where the structures were formed on the substrate surface. 915 denotes an area where ITO thin film was formed, wherein the ITO film had a thickness of 150 nm.

A method for producing the conductive oxide-deposited substrate shown in FIGS. 8 and 9 will be explained on the basis of FIG. 2B.

A film deposition step 101, a heat treatment step by a condensed laser beam 104 and etching treatment step 107 are the same as described above. 109 denotes a second film deposition step. A film was deposited by sputtering using In$_2$O$_3$—SnO$_2$ (ITO) as a sputtering target in a mixed gas atmosphere consisting of argon (Ar) and oxygen (O$_2$) at a pressure of 0.8 Pa with the substrate temperature kept at room temperature. The film had a thickness of 150 nm.

By setting O$_2$ flow rate at 2 sccm, an ITO thin film having high transmittance was deposited. The transmittance of the ITO thin film deposited under the above-described conditions was measured by a UV-VIS Spectrophotometer (UV-2500 (PC)SGLP manufactured by Shimadzu corporation). The ITO thin film had a transmittance of 59% at a wavelength of 400 nm. It was confirmed that the ITO thin film had a high transmittance because of film deposition by introducing O$_2$ gas.

In the heat treatment step by a condensed laser beam 104, an area which was not irradiated with a laser beam in the ITO thin film was completely removed in an etching step 107 and an ITO thin film was deposited again in a second film deposition step 109. Thus, as shown in FIG. 9, an area where ITO structures were located 914 and an area of the ITO thin film 915 could be formed in any positions and pitches on the substrate surface. According to a functional device, the ITO structure area and the ITO thin film area could be controlled by a simple and easy method.

Example A-4

Figure 10A:
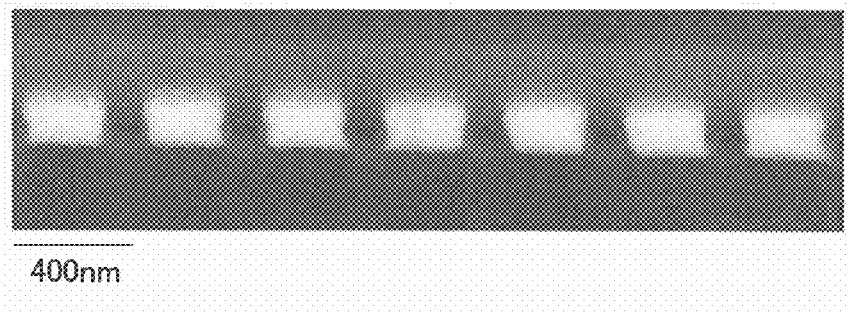
FIG. 10A is a cross sectional SEM image of a conductive oxide-deposited substrate in which an edge of a substrate is substantially vertical shape.
Figure 10B:
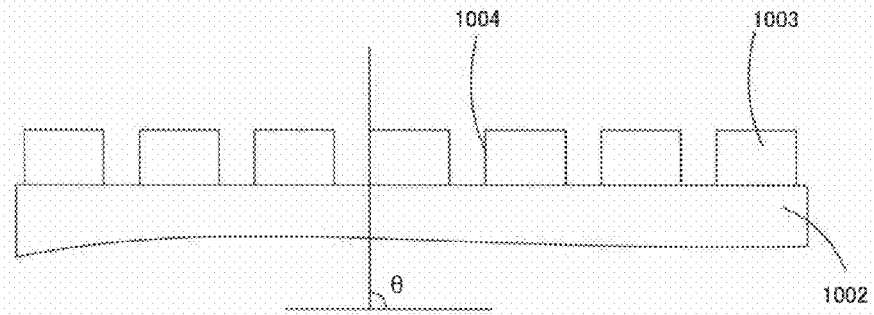
FIG. 10B is a schematic view corresponding to FIG. 10A.
Figure 10C:
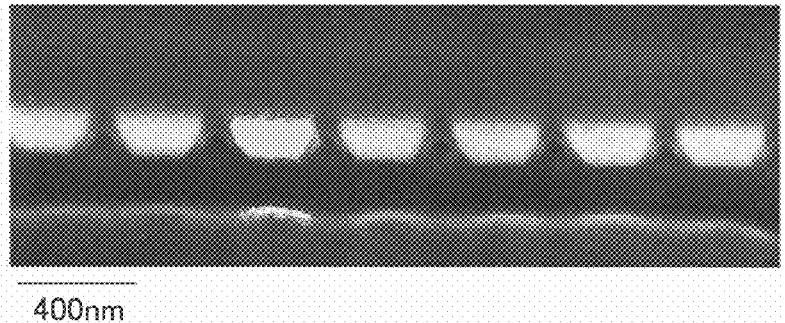
FIG. 10C is a cross sectional SEM image of a conductive oxide-deposited substrate in which an edge of a structure expands in a direction away from a substrate surface.
Figure 10D:
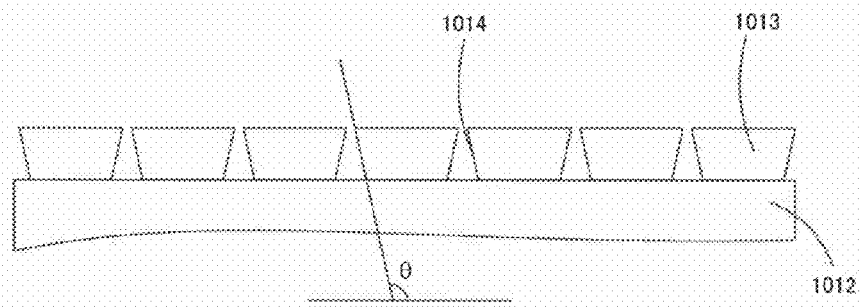
FIG. 10D is a schematic view corresponding to FIG. 10C.

FIG. 10A is an example in which an edge of a conductive oxide (structure) is substantially vertical shape, for example, approximately 90°±5°, and FIG. 10C is an example in which an edge of a conductive oxide (structure) is a so-called reverse-tapered shape in which a diameter of a structure expands with increasing distance from a substrate surface. That is, FIG. 10A is a cross sectional SEM image of a conductive oxide-deposited substrate in which an edge of a structure (an edge of a conductive part) is substantially vertical. 1002 denotes a polycarbonate substrate, 1003 denotes a structure of ITO, and 1004 denotes an edge of the structure. As shown in FIG. 10A, the edge of the structure is substantially vertical. FIG. 10C is a cross sectional SEM image of a conductive oxide-deposited substrate in which an edge of a structure (an edge of a conductive part) is a reverse-tapered shape. 1012 denotes a supporting substrate of polycarbonate, 1013 denotes a structure of ITO, and 1014 denotes an edge of the structure. As shown in FIG. 10C, the edge of the structure is a reverse-tapered shape. As described in this Example, the edge of the structure is formed in which a diameter expands with increasing distance from the substrate surface. The degree of expansion is represented by approximately $90° < \theta < 120°$.

The laser irradiation conditions differ between the substantially vertical-shaped structure in FIG. 10A and the reverse-tapered structure in FIG. 10C.

A method for producing a conductive oxide-deposited substrate shown in FIG. 10A is explained on the basis of FIG. 2A.

In FIG. 2A, 101 denotes a conductive oxide film deposition step. 102 denotes a supporting substrate of polycarbonate, and 103 denotes an ITO thin film of a conductive oxide thin layer. The ITO thin film was deposited by sputtering using In$_2$O$_3$—SnO$_2$ (ITO) as a sputtering target in an argon (Ar) atmosphere at a pressure of 0.8 Pa under the condition that the substrate was not heated. The film had a thickness of 150 nm.

The ITO thin film, which absorbed an irradiated laser beam to be thermally changed, was deposited only in an argon gas without introducing O$_2$. In a heat treatment step 104, a sample was irradiated with a laser beam from a film surface of the sample as shown in 105 so as to be condensed on the substrate using a laser diode having a wavelength of 405 nm and an objective lens having a numerical aperture (NA) of 0.85. The sample was irradiated with the laser beam, while being rotated as shown in FIG. 3. The rotational speed was 4.5 m/sec. When the vertical-shaped structure shown in FIG. 10A was formed, the laser power was modulated between 7 mW and 0.1 mW, and a pulse width, i.e. a time for maintaining the power of 7 mW was 23 nsec.

On the other hand, when the reverse-tapered structure shown in FIG. 10C was formed, the laser power was modulated between 9 mW and 0.1 mW, and a pulse width, i.e. a time for maintaining the power of 9 mW was 23 nsec. 107 denotes an etching step. The etching step was performed in which a sample irradiated with the laser was immersed in a hydrochloric acid aqueous solution (HCl+H$_2$O) so as to be etched.

The etching temperature was room temperature, and the amount of HCl in the hydrochloric acid aqueous solution was 3.5% by mass. The sample was immersed in the hydrochloric acid aqueous solution for 90 seconds so as to form a plurality of structures consisting of the ITO shown respectively in FIGS. 10A and 10C.

By controlling the conditions of laser beam irradiation, an ITO-deposited substrate having reverse-tapered structures could be formed as shown in FIG. 10C.

Example A-5

Table 1 shows conductive oxide materials which can be processed in a convex-shaped structure according to the present invention, and the conditions of film deposition step 101, a heat treatment step by laser beam irradiation 104 and an etching treatment step 107 shown in FIG. 2A. In Table 1, the method for producing a structure of $In_2O_3$—$SnO_2$ (ITO) and a method for producing a structure of conductive oxide other than ITO are compared.

ous solution was 3.5% by mass. Thus, the structure of $In_2O_3$ 108 was formed as shown in 107 of FIG. 2A.

A method for producing a structure of $SnO_2$ is shown in Table 1 (c). In the structure shown as in 101 of FIG. 2A, 102 denotes a polycarbonate substrate, 103 denotes a $SnO_2$ thin film. A $SnO_2$ thin film was deposited by radiofrequency (RF)

TABLE 1

| | | Conductive oxide material | | |
|---|---|---|---|---|
| | | (a) $In_2O_3$—$SnO_2$ (ITO) | (b) $In_2O_3$ | (c) $SnO_2$ |
| Conditions of film deposition by sputtering | Target composition | $In_2O_3$(95 mass %)—$SnO_2$ (5 mass %) | $In_2O_3$ (100 mass %) | $SnO_2$ (100 mass %) |
| | System | DC sputter | DC sputter | RF sputter |
| | Power (W) | 400 | 400 | 200 |
| | Ar flow rate (sccm) | 40 | 40 | 40 |
| | $O_2$ flow rate (sccm) | 0 | 0 | 0 |
| | film thickness (nm) | 150 | 150 | 200 |
| Crystalline state after film deposition (X-ray diffraction measurement) | | containing amorphous | containing amorphous | amorphous |
| Laser irradiation | Laser power (mW) | 8 | 8 | 10 |
| | Pulse width (nsec) | 11 | 11 | 22 |
| | Irradiation pitch (nm) | 400 | 400 | 800 |
| Etching | Solution | HCl | HCl | HF |
| | Concentration (mass %) | 3.5 | 3.5 | 33 |
| Crystalline state of structure (X-ray diffraction measurement) | | Polycrystalline state | Polycrystalline state | Polycrystalline state |

A method for producing a structure of $In_2O_3$ is shown in Table 1 (b). In the structure shown as in 101 of FIG. 2A, 102 denotes a polycarbonate substrate, 103 denotes an $In_2O_3$ thin film. An $In_2O_3$ thin film was deposited by DC sputtering in an argon (Ar) atmosphere without adding oxygen ($O_2$ flow rate=0%) at a pressure of 0.8 Pa. The composite ratio (mass ratio) of a target material was 100% by mass of $In_2O_3$. The $In_2O_3$ thin film (103 in FIG. 2A) had a thickness of 150 nm. The transmittance of the $In_2O_3$ thin film deposited under the above-described conditions was measured by a UV-VIS Spectrophotometer (UV-2500(PC)SGLP manufactured by Shimadzu corporation). The $In_2O_3$ thin film had a transmittance of 24% at a wavelength of 400 nm. It was confirmed that the $In_2O_3$ thin film was in a state that it absorbed a laser beam. The deposited $In_2O_3$ thin film was measured by the X-ray diffraction in the same manner as the ITO thin film. In the diffraction patterns, a peak in the diffraction pattern of a crystalline phase and a broad peak in the diffraction pattern of an amorphous phase were observed. Thus, the $In_2O_3$ thin film was in a state where both the crystalline phase and the amorphous phase were present. Next, as shown in 104 of FIG. 2A, the $In_2O_3$ thin film was irradiated with a laser beam. A sample was irradiated with a laser beam from a film surface of the sample, i.e. from a surface on which a conductive oxide film was deposited on the substrate (105 of FIG. 2A) so as to be condensed on the sample surface using a laser diode having a wavelength of 405 nm as a laser beam source and an objective lens having a numerical aperture (NA) of 0.85. The sample was irradiated with the laser beam, while being rotated as shown in FIG. 3 (104 of FIG. 2A). The rotational speed of the sample was 4.5 m/sec. When the sample was irradiated with the laser beam, the laser power was modulated between 8 mW and 0.1 mW, a pulse width, i.e. a time for maintaining the power of 8 mW was 11 nsec, and a pulse pitch was 400 nm. The sample irradiated with the laser beam was immersed in a hydrochloric acid aqueous solution (HCl+$H_2O$) as an etching solution so as to be etched. The etching temperature was room temperature, i.e. under the condition that the substrate was not heated, and the amount of HCl in the hydrochloric acid aquesputtering in an argon (Ar) atmosphere without adding oxygen ($O_2$ flow rate=0%) at a pressure of 0.8 Pa. The composite ratio (mass ratio) of a target material was 100% by mass of $SnO_2$. The $SnO_2$ thin film (103 in FIG. 2A) had a thickness of 200 nm. The transmittance of the $SnO_2$ thin film deposited under the above-described conditions was measured by a UV-VIS Spectrophotometer (UV-2500(PC)SGLP manufactured by Shimadzu corporation). The $SnO_2$ thin film had a transmittance of 23% at a wavelength of 400 nm. It was confirmed that the $SnO_2$ thin film was in a state that it absorbed a laser beam. The $SnO_2$ thin film was measured by the X-ray diffraction in the same manner as the ITO thin film. Only a broad peak in the diffraction pattern of an amorphous phase was observed. Thus, the deposited $SnO_2$ thin film was an amorphous phase without containing crystalline phase. Next, as shown in 104 of FIG. 2A, the $SnO_2$ thin film was irradiated with a laser beam. A sample was irradiated with a laser beam from a film surface of the sample, i.e. from a surface on which a conductive oxide film was deposited on the substrate (105 of FIG. 2A) so as to be condensed on the sample surface using a laser diode having a wavelength of 405 nm as a laser beam source and an objective lens having a numerical aperture (NA) of 0.85. The sample was irradiated with the laser beam, while being rotated as shown in FIG. 3 (104 of FIG. 2A). The rotational speed of the sample was 4.5 m/sec. When the sample was irradiated with the laser beam, the laser power was modulated between 10 mW and 0.1 mW, a pulse width, i.e. a time for maintaining the power of 8 mW was 22 nsec, and a pulse pitch was 800 nm. The sample irradiated with the laser was subjected to etching treatment. The $SnO_2$ thin film could not be etched in a hydrochloric acid aqueous solution (HCl+$H_2O$) which was used for the etching treatment of ITO or $In_2O_3$ thin film. The $SnO_2$ thin film was immersed in a hydrofluoric acid solution (HF+$H_2O$) used as an etching solution.

The etching temperature was room temperature, i.e. under the condition that the substrate was not heated, and the amount of HF in the hydrofluoric acid solution was 33% by mass. Thus, the structure of $SnO_2$ 108 was formed as shown in 107 of FIG. 2A.

Thus, by a method for producing a conductive oxide-deposited substrate such as $In_2O_3$—$SnO_2$ (ITO) of the present invention, a substrate on which a conductive oxide is processed into a shape by an easy process mainly including a heat treatment step and etching treatment step, can be produced at low cost compared to the conventional technology.

For example, by a high efficiency process in which the conductive oxide-deposited substrate is irradiated with a laser beam, while the conductive oxide-deposited substrate is being rotated in the heat treatment step, a substrate on which the conductive oxide is finely processed can be produced.

The conductive oxide-deposited substrate of the present invention can be used as a substrate having a surface electrode.

Examples of devices which need the surface electrode include solar batteries and illumination devices using solid light sources. These devices may have a structure in which a functional layer (a photoelectric conversion layer in the solar battery, and an emission layer in the illumination device) is laminated on the surface electrode of a conductive oxide. A fine structure formed in the present invention is densely contained in the surface electrode, so that the effective surface area of the functional layer deposited on the surface electrode is increased. As a result, efficiency of the device, such as operation performance, operation speed etc. is enhanced.

Reference Example B-1

Figure 14A:
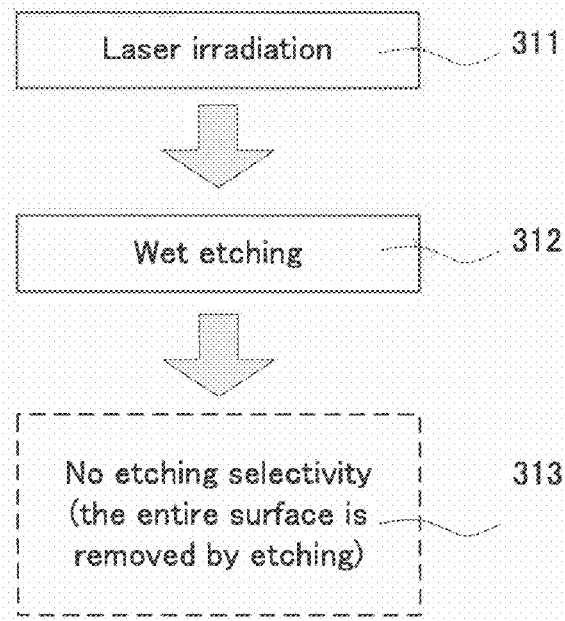
FIG. 14A is a flow chart illustrating a process in which a single layer of semiconductor material is deposited on a substrate and then subjected to laser beam irradiation and wet etching treatment in Reference Example B-1.

Before Example B is performed, a single layer of a semiconductor material layer was deposited on the substrate and irradiated with a laser beam, and then subjected to wet etching, so as to form a given structural pattern. This process is illustrated in FIG. 14A.

Figure 14B:
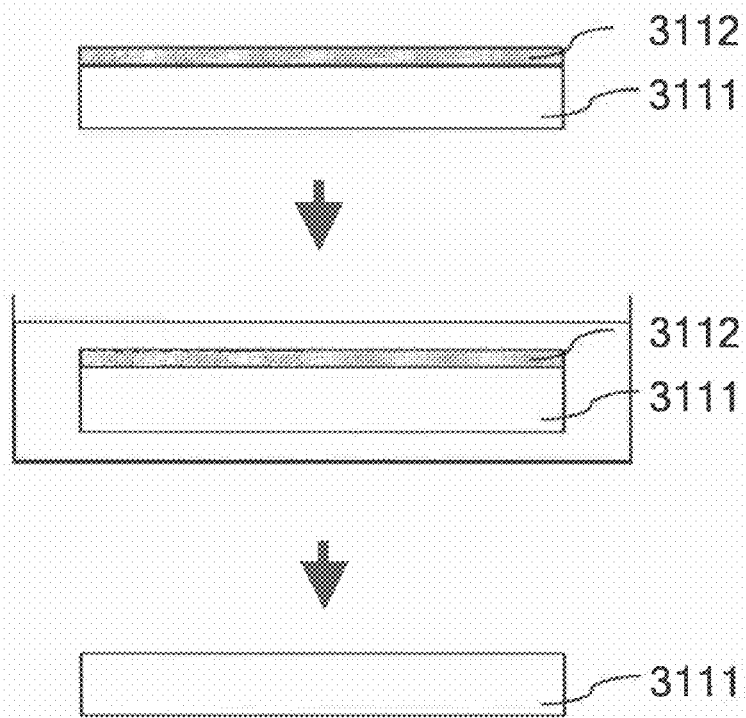
FIG. 14B shows a sample structure and a laser irradiation in the process illustrated in FIG. 14A.

FIG. 14B shows a sample structure and a laser irradiation state. 3111 denotes a polycarbonate substrate, and 3112 denotes an InGaZnO thin film. The InGaZnO thin film was deposited by sputtering in an argon (Ar) atmosphere at room temperature, i.e. under the condition that the substrate was not heated. The InGaZnO thin film had a thickness of 100 nm.

The sample was irradiated with a laser beam having a wavelength of 405 nm (311), and then subjected to wet etching treatment (312) using a hydrochloric acid aqueous solution ($HCl+H_2O$) as an etching solution. The amount of HCl in the hydrochloric acid aqueous solution was 3.5% by mass. The etching temperature was room temperature, i.e. under no heating condition. As shown in 313, after etching treatment, the entire surface of the InGaZnO thin film was etched away. That is, the InGaZnO thin film had not been thermally changed, for example, thermal alteration such as crystallization, by laser beam irradiation, because it had poor light absorption ability. Thus, there was no etching selectivity between the part which had been irradiated with the laser beam and the part which had not been irradiated with the laser beam, and the entire surface of the sample was etched away. A given structural pattern could not be formed.

Example B-1

Figure 19A:
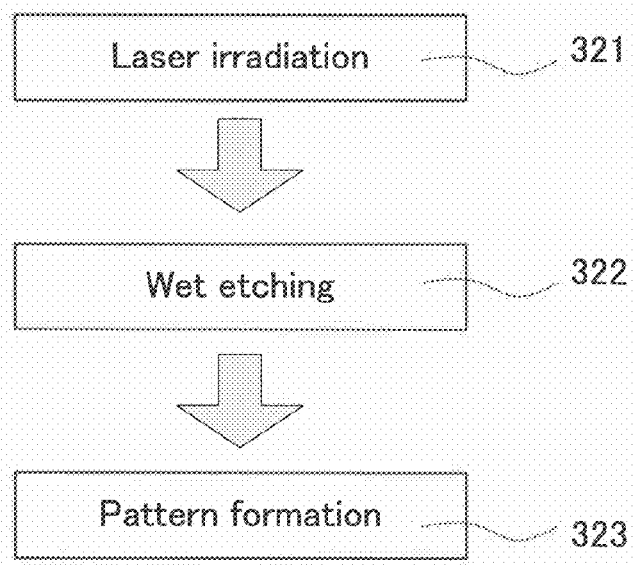
FIG. 19A is a flow chart illustrating a step used in the production of a MIS laminated structure in Example B-1.

According to the steps of the flow chart shown in FIG. 19A and frame format shown in 19B, a MIS laminated structure was produced. In Reference Example B-1, a single layer of an InGaZnO thin film could not be processed by laser beam irradiation and wet etching treatment. However, when the InGaZnO thin film was formed in a MIS laminated structure, a laminated layer including the InGaZnO thin film could be processed by laser beam irradiation and wet etching treatment.

Figure 19B:
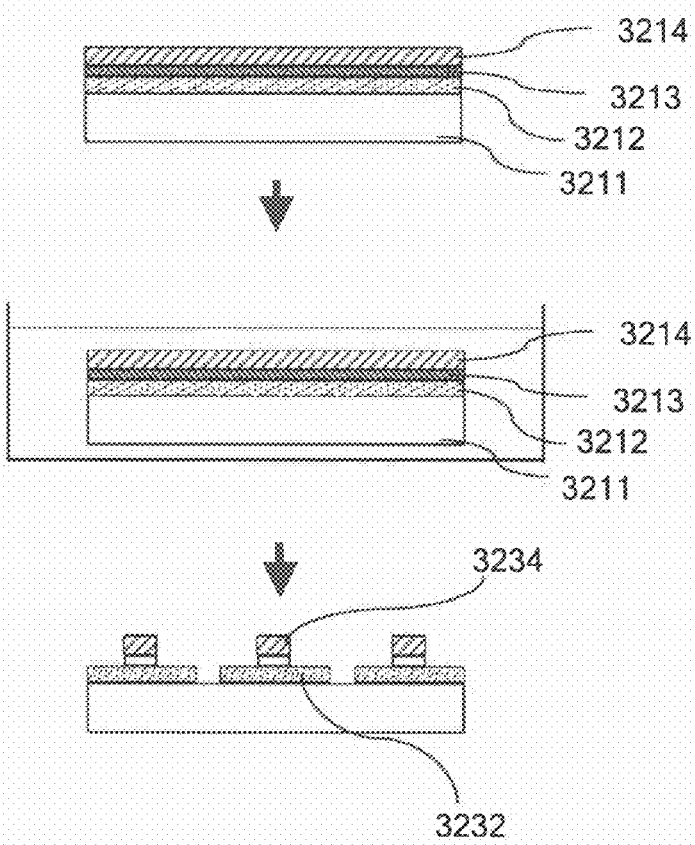
FIG. 19B is a frame format of FIG. 19A.

In FIG. 19B, an InGaZnO ($In_2O_3$:$Ga_2O_3$:ZnO=1:1:1) thin film of a semiconductor material layer 3212, a thin film of a mixture of ZnS and $SiO_2$ (ZnS—$SiO_2$) of an insulating material layer 3213, and an $In_2O_3$—$SnO_2$ (ITO) thin film of a conductive oxide material layer 3214 were deposited in this order over a polycarbonate substrate (supporting substrate) 3211 so as to form a MIS laminated structure. Each layer was deposited by sputtering in an argon (Ar) atmosphere at room temperature, i.e. under the condition that the substrate was not heated. The InGaZnO thin film had 50 nm-thick, ZnS—$SiO_2$ thin film had 30 nm-thick, and ITO thin film had 100 nm-thick.

In the layer structure as described above, the conductive oxide layer, ITO thin film 3214 had a characteristic state. The state of the ITO thin film will be explained. FIG. 11 is a graph showing a change of transmittance depending on film deposition conditions of an ITO thin film. The ITO thin film was deposited by DC sputtering using a composite oxide of $In_2O_3$—$SnO_2$ (ITO) as a sputtering target at a pressure of 0.8 Pa with the substrate temperature kept at room temperature, i.e. under no heating condition. The composite ratio (mass ratio) of the target material, $In_2O_3$:$SnO_2$ was 95:5 (% by mass). The ITO thin film had a thickness of 150 nm. A plurality of ITO thin films were deposited by changing the ratio of argon (Ar) and oxygen ($O_2$), which were used as atmospheric gas, and the transmittance thereof were respectively measured by a UV-VIS Spectrophotometer (UV-2500 (PC)SGLP manufactured by Shimadzu corporation).

In FIG. 11, the horizontal axis represents a mixing ratio between Ar and $O_2$ based on oxygen flow rate (%) "$O_2$ flow rate/($O_2$+Ar flow rate)". The vertical axis represents transmittance (%). The transmittance was measured at the wavelength range of 250 nm to 800 nm. FIG. 11 shows a transmittance value at a wavelength of 400 nm. As shown in FIG. 11, the transmittance at a wavelength of 400 nm decreased, as the oxygen flow rate became small. The ITO thin film had a transmittance of 22%, when it was deposited in an argon atmosphere without introducing $O_2$ (oxygen flow rate=0%). The oxygen deficiency in the ITO thin film caused the decrease of transmittance due to the decrease of oxygen flow rate. The oxygen deficiency is a state where a thin film contains less oxygen than that of stoichiometric composition at least in part. Namely, the oxygen deficiency is the state described as follows. The ITO thin film originally has a composite ratio of $In_2O_3$—$SnO_2$. When the true composite ratio of the ITO thin film in the state of the oxygen deficiency is expressed by $In_2O_x$—$SnO_y$, x is less than three (x<3) and y is less than two (y<2). Note that, x and y each represents a valency of oxygen atom in the composition. When the ITO thin film had a transmittance of 10% to 30% at a wavelength of 400 nm, the absorption ability of a laser beam was improved so that a thin film could generate heat by laser beam irradiation and be thermally changed, as described later. The minimum value of the transmittance was 10%, because it was the minimum value obtained by easy control of oxygen flow rate in film deposition by sputtering. When the transmittance was higher than 30%, excessively high energy was necessary to thermally change the conductive oxide thin film by laser beam irradiation thereby requiring an expensive laser beam irradiation device. Thus, an inexpensive semiconductor laser could not be used. The crystalline state of the ITO thin film was an amorphous phase at least in a part thereof.

Next, a method for processing a MIS laminated structure, in which an ITO thin film in the above-described state is laminated as the outermost layer will be explained with reference to FIG. 19B. The MIS laminated structure was processed into a convex-shaped structure.

Upon a timing of modulation of laser beam power level, the power level of the laser beam was modulated at three levels in the laser beam irradiation step. Three levels were low (2 mW), middle (8 mW), and high (14 mW).

322 denotes wet etching treatment and a hydrochloric acid aqueous solution ($HCl+H_2O$) was used as an etching solution similar to FIGS. 14A and 14B. The amount of HCl in the hydrochloric acid aqueous solution was 3.5% by mass. The etching temperature was room temperature, i.e. under no heating condition.

Figure 21:
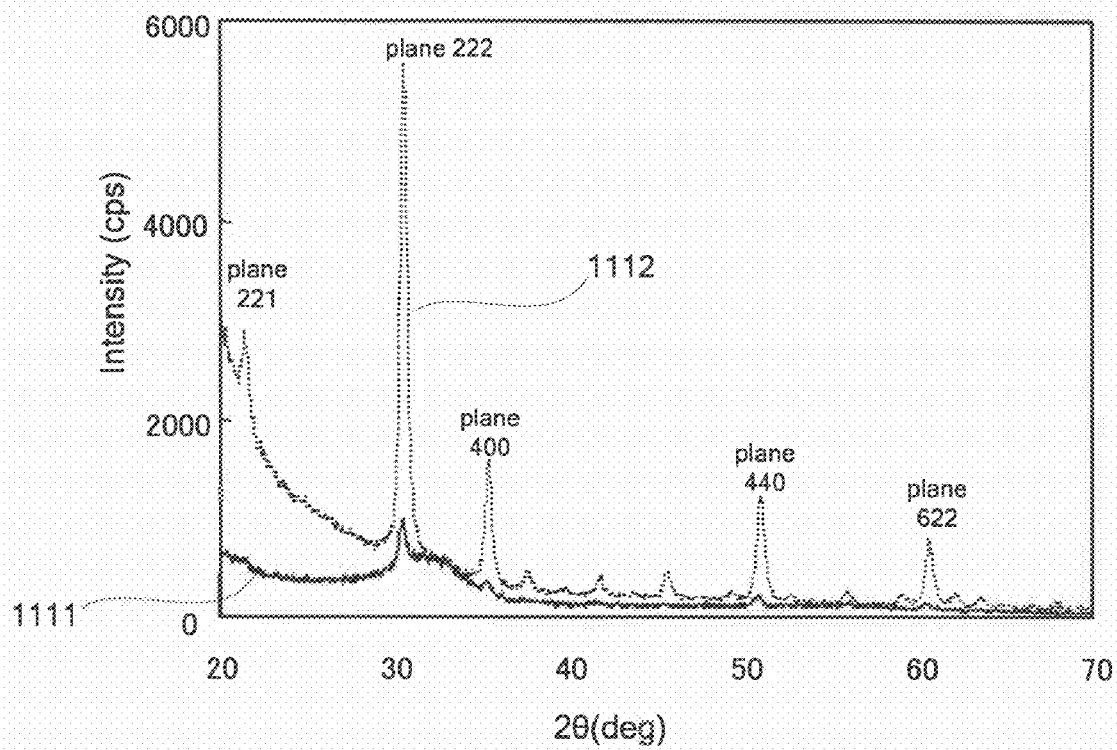
FIG. 21 is an X-ray diffraction profiles of a MIS laminated structure produced in Example B-1.

The lowermost figure in FIG. 19B denotes a state of the sample which had been subjected to wet etching treatment. The ITO thin film 3214, which was located as the outermost layer in the laminated structure, generated heat by absorbing the laser beam. A part of the ITO thin film 3214 was thermally changed by heat generation, and the heat spread to an InGaZnO thin film 3212 under the ITO thin film 3214, and then a part of the InGaZnO thin film 3212 was thermally changed (crystallized). The degree of thermal change (crystallization) is shown in FIG. 21. FIG. 21 is a result of X-ray diffraction measurements of the MIS laminated structure. With reference to the result of the X-ray diffraction measurements, the crystalline state of the MIS laminated structure will be explained. The MIS laminated structure had a layer structure consisting of an InGaZnO thin film 3212, a ZnS—$SiO_2$ thin film 3213, and an ITO thin film 3214 as shown in the top figure of FIG. 19B. Measurement was performed by using an X-ray diffraction device (X'Pert MRD manufactured by Philips Electronics) under the conditions of a Cu$K\alpha$ radiation as an X-ray source, an accelerating voltage of 45 keV, and a current value of 40 mA. In FIG. 21, 1111 denotes an X-ray diffraction profile of MIS laminated structure after film deposition and 1112 denotes an X-ray diffraction profile of MIS laminated structure which had been processed into a convex shape. The X-ray diffraction profile of MIS laminated structure which had been processed into a convex shape 1112 was measured in a state where a plurality of structures were contained in an X-ray irradiated area. In the X-ray diffraction profile of MIS laminated structure after film deposition 1111, a small diffraction peak corresponding to a plane 222 of the ITO thin film around 30°, and a broad peak of an amorphous phase were observed. Thus, the MIS laminated structure was in a state where both the crystalline phase and the amorphous phase were present. On the other hand, in the X-ray diffraction profile of MIS laminated structure which had been processed into a convex shape 1112, sharp diffraction peaks corresponding to a plane 222, a plane 400, a plane 440, and a plane 622 of the ITO thin film were observed. Thus, the MIS structure in a polycrystalline state was formed.

The etching rate of the thermally changed part was lower than that of the part which was not irradiated with the laser beam in the ITO thin film 3214 by wet etching treatment, so that the thermally changed part could be processed into a convex-shaped structure without being etched away. As the convex-shaped structure of ITO served as an etching mask, the ZnS—$SiO_2$ thin film 3213 under the convex-shaped structure also remained without being etched away. An InGaZnO thin film 3212 located as the undermost layer had an etching selectivity between the irradiated part and non-irradiated part, and could be processed into the convex-shaped structure.

Figure 19C:
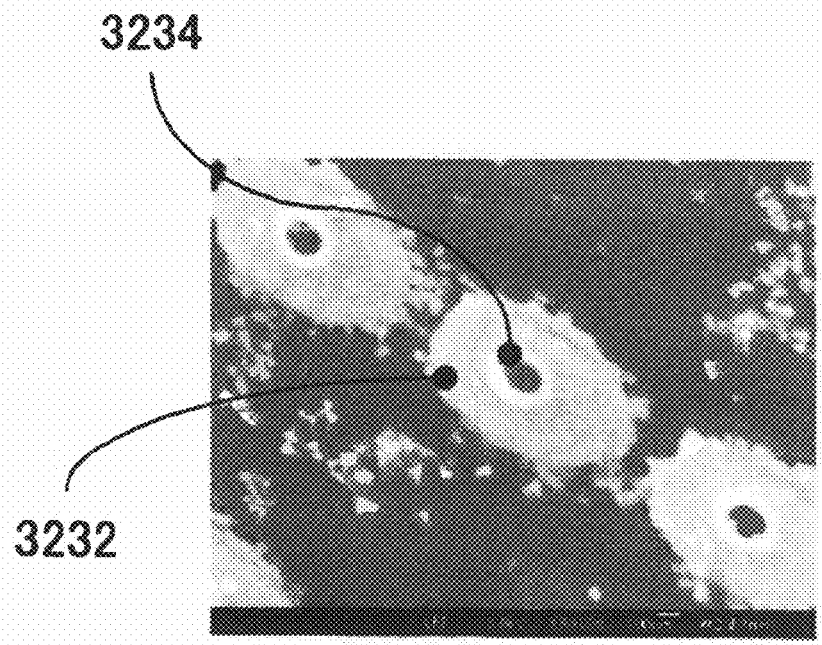
FIG. 19C is a scanning electron microscope (SEM) image in which a state of processed sample is observed above.

FIG. 19C is a scanning electron microscope (SEM) image in which a state of processed sample shown in the lowermost figure is observed above. A small circle 3234 observed in a bright contrast part is a structural pattern of ITO, and a larger ellipse part 3232 in the under layer of the small circle is a structural pattern of InGaZnO. The dark contrast part is a surface of a polycarbonate substrate. That is, the heat generated in the upper layer of the ITO thin film spreads in the under layer and the heat tends to be accumulated in the under layer because of the laminated structure, and the thermally changed (thermally altered) area in the InGaZnO thin film was spread. Therefore, the under layer of the structural pattern of InGaZnO was formed larger than the upper layer of the structural pattern of ITO.

Thus, the MIS laminated structure could be processed by the thermal change (thermal alteration) of the material heated by laser beam irradiation and wet etching treatment by using the etching selectivity between the thermally changed part and non-changed part, without using photolithography. According to the present invention, the semiconductor material layer of InGaZnO can be suitably formed into a given structural pattern, though it cannot be processed into a convex-shaped structural pattern in Reference Example B-1.

Example B-2

According to the process shown in FIG. 18A, an ITO thin film 4051 as a conductive oxide material layer M2 was deposited on the MIS laminated structure produced in Example B-1. The ITO thin film was deposited by sputtering only in an argon atmosphere in order to be in an oxygen deficiency state. The ITO thin film had a thickness of 150 nm.

From a side of the deposited ITO thin film M2, the ITO thin film M2 was irradiated with a laser beam by modulating the power level so as to be thermally changed in part. Next, a part of the ITO thin film M2 which had not been thermally changed was etched away by wet etching to form a source electrode and a drain electrode. As an etching solution, a hydrochloric acid aqueous solution ($HCl+H_2O$) was used similar to Example B-1. The etching temperature was room temperature, i.e. under no heating condition, and the amount of HCl in the hydrochloric acid aqueous solution was 3.5% by mass. The source electrode and drain electrodes were formed in contact with a semiconductor area. The edges of the MIS laminated structure were curved, so-called a circular arc-shape as shown in FIG. 18C.

According to the present invention, a MIS laminated structure which is a basic structure of a switching element, and a switching element, in which electrodes (a source electrode and a drain electrode) are formed in the MIS laminated structure, can be produced only by an easy process including heat treatment by laser beam irradiation and etching treatment. The production cost can be reduced by simplifying the production process. The MIS laminated structure is irradiated with a condensed laser beam and processed by etching treatment to form fine and regular MIS laminated structure, thereby stably producing an element having high reliability.

A MIS laminated structure and a method for producing the MIS laminated structure of the present invention are not limited to be used as a switching element, but also used as a photoelectric conversion part of a light receiving element such as optical sensor. According to the present invention, as fine and regular MIS laminated structures can be produced, a sensor having high resolution can be expected to be achieved.

What is claimed is:
1. A conductive oxide-deposited substrate produced by a method for producing a conductive oxide-deposited substrate comprising:
    depositing a conductive oxide thin film over a substrate;
    subjecting the conductive oxide thin film to heat treatment by irradiating with a condensed laser beam of wavelength of from 360 nm to 420 nm so as to be thermally changed in part; and subjecting the conductive oxide thin film to etching treatment so as to remove a part which has not been thermally changed, wherein the conductive oxide thin film has a transmittance of 10% to 30% of a laser beam of wavelength 400 nm, and at least a part of the conductive oxide thin film is an amorphous phase, and wherein a convex-shaped structure of the thermally changed conductive oxide is formed on at least one surface of the substrate.

2. The conductive oxide-deposited substrate according to claim 1, wherein the conductive oxide-deposited substrate comprises a plurality of the convex-shaped structures on the substrate, and the convex-shaped structures are arranged at a pitch of 200 nm to 500 nm on the substrate.

3. The conductive oxide-deposited substrate according to claim 1,
wherein the substrate comprises a plastic material selected from polycarbonate, acrylic resins, polyethylene terephthalate (PET), polybutylene terephthalate (PBT), and PBT-PET.

4. The conductive oxide-deposited substrate according to claim 1, wherein the conductive oxide comprises a material selected from $In_2O_3$—$SnO_2$, $In_2O_3$, and $SnO_2$.

5. The conductive oxide-deposited substrate according to claim 1,
wherein the conductive oxide thin film is produced only in an argon atmosphere without $O_2$, and
wherein at least a part of the conductive oxide thin film is an amorphous phase.

6. A MIS laminated structure comprising:
a supporting substrate; and
a semiconductor material layer S, an insulating material layer I, and a conductive oxide material layer M are deposited in this order over the supporting substrate so as to form the MIS laminated structure,
wherein the MIS laminated structure is produced by a method for producing a MIS laminated structure by condensed laser beam irradiation of wavelength from 360 nm to 420 nm and etching treatment, comprising:
depositing a semiconductor material layer S, an insulating material layer I, and a conductive oxide material layer M in this order over the supporting substrate so as to form the MIS laminated structure;
subjecting the MIS laminated structure to heat treatment by irradiating with a condensed laser beam from the conductive oxide material layer side so as to thermally change a part of the conductive oxide material layer, and to thermally change a part of the semiconductor material layer by heat spread in the MIS laminated structure; and
subjecting the MIS laminated structure to etching treatment so as to remove a part which has not been thermally changed,
wherein the conductive oxide thin film has a transmittance of 10% to 30% of a laser beam of wavelength 400 nm, and at least a part of the conductive oxide thin film is an amorphous phase.

7. The MIS laminated structure according to claim 6, wherein the semiconductor material layer S comprises a material selected from $In_2O_3$, $SnO_2$ and ZnO.

8. The MIS laminated structure according to claim 6, wherein a processed part of the MIS laminated structure is circle or elliptical shape.

9. The MIS laminated structure according to claim 6,
wherein the substrate comprises a plastic material selected from polycarbonate, acrylic resins, polyethylene terephthalate (PET), polybutylene terephthalate (PBT), and PBT-PET.

10. The MIS laminated structure according to claim 6,
wherein the conductive oxide comprises a material selected from $In_2O_3$—$SnO_2$, $In_2O_3$, and $SnO_2$.

11. The MIS laminated structure according to claim 6,
wherein the conductive oxide thin film is produced only in an argon atmosphere without $O_2$, and
wherein at least a part of the conductive oxide thin film is an amorphous phase.

\* \* \* \* \*